US007733120B2

(12) United States Patent
Kato et al.

(10) Patent No.: US 7,733,120 B2
(45) Date of Patent: Jun. 8, 2010

(54) IMPEDANCE ADJUSTMENT CIRCUIT

(75) Inventors: Hiromu Kato, Kanagawa (JP);
Masahiro Takeuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/379,464

(22) Filed: Feb. 23, 2009

(65) Prior Publication Data

US 2009/0212816 A1    Aug. 27, 2009

(30) Foreign Application Priority Data

Feb. 26, 2008    (JP)    ............... 2008-044382

(51) Int. Cl.
*H03K 17/16*    (2006.01)
*H03K 19/003*    (2006.01)
(52) U.S. Cl. ...................... 326/30; 326/87; 327/112
(58) Field of Classification Search ................. 326/30, 326/82–83, 86–87; 327/108–109, 112
See application file for complete search history.

(56) References Cited

U.S. PATENT DOCUMENTS

| | | | | |
|---|---|---|---|---|
| 5,254,883 | A * | 10/1993 | Horowitz et al. | 326/30 |
| 6,064,224 | A * | 5/2000 | Esch et al. | 326/30 |
| 6,429,679 | B1 * | 8/2002 | Kim et al. | 326/30 |
| 6,525,558 | B2 * | 2/2003 | Kim et al. | 326/30 |
| 6,812,735 | B1 * | 11/2004 | Pham | 326/30 |
| 6,828,820 | B2 | 12/2004 | Ohno | |
| 6,836,142 | B2 * | 12/2004 | Lesea et al. | 326/30 |
| 6,937,055 | B2 * | 8/2005 | Roy et al. | 326/30 |
| 7,038,486 | B2 * | 5/2006 | Aoyama et al. | 326/30 |
| 7,230,448 | B2 * | 6/2007 | Choe | 326/30 |
| 7,382,153 | B2 * | 6/2008 | Ou-yang et al. | 326/30 |
| 7,459,930 | B2 * | 12/2008 | Mei | 326/30 |
| 7,514,954 | B2 * | 4/2009 | Kim et al. | 326/30 |
| 7,633,310 | B2 * | 12/2009 | Fukushi | 326/30 |
| 2006/0158213 | A1 * | 7/2006 | Allan | 326/30 |

FOREIGN PATENT DOCUMENTS

JP    2004-32721    1/2004

* cited by examiner

*Primary Examiner*—James H. Cho
*Assistant Examiner*—Jason Crawford
(74) *Attorney, Agent, or Firm*—McGinn IP Law Group, PLLC

(57) ABSTRACT

Disclosed is an impedance adjustment circuit including a comparator and a resistor control circuit. The comparator compares the resistance value of an external resistor and that of a replica resistor that forms a replica of a terminal resistor. The resistor control circuit includes a replica resistor control counter, a resistor-under-adjustment control signal holding circuit and a monitor circuit. The replica resistor control counter counts up and down based on the comparison result by the comparator to output a control signal to the replica resistor. The resistor-under-adjustment control signal holding circuit holds a control signal that is delivered to the terminal resistor. The monitor circuit receives the state of the counter and an output of the retention circuit and, in case the difference between the count state of the replica resistor control counter and an output of the resistor-under-adjustment control signal holding circuit is within a preset range, delivers the output of the resistor-under-adjustment control signal holding circuit as an input to the resistor-under-adjustment control signal holding circuit.

16 Claims, 34 Drawing Sheets

FIG. 4

| INPUT | OUTPUT |
|---|---|
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

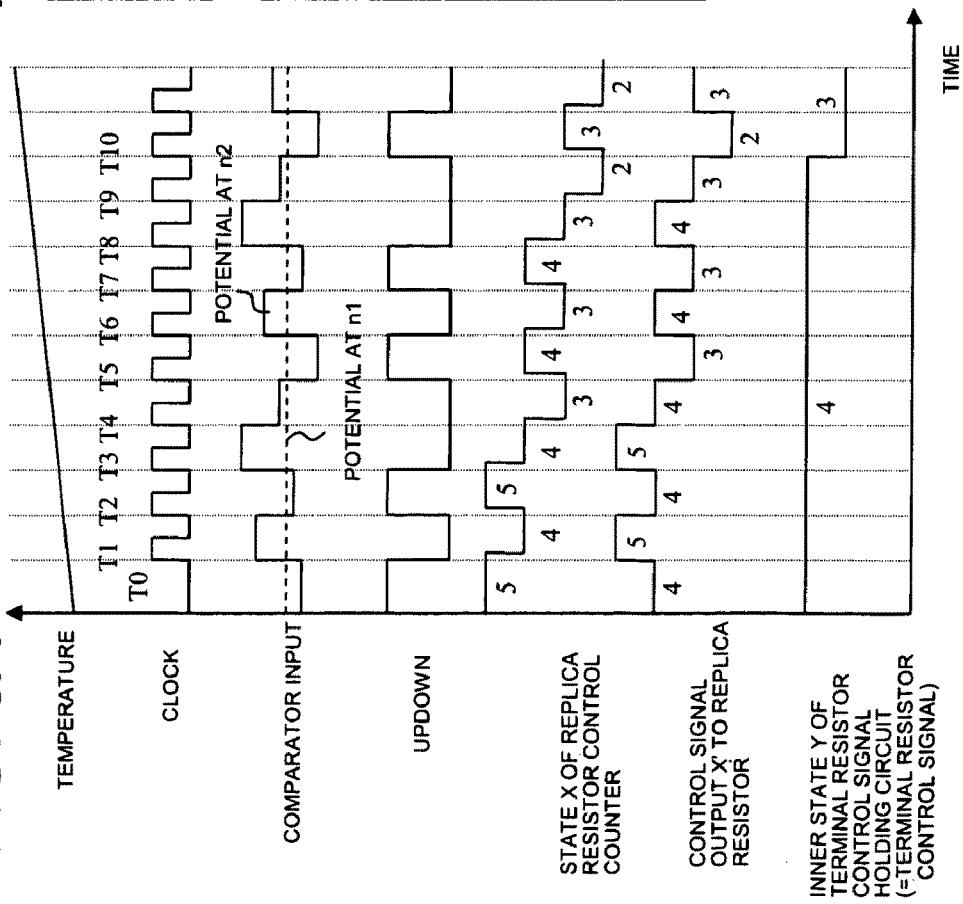

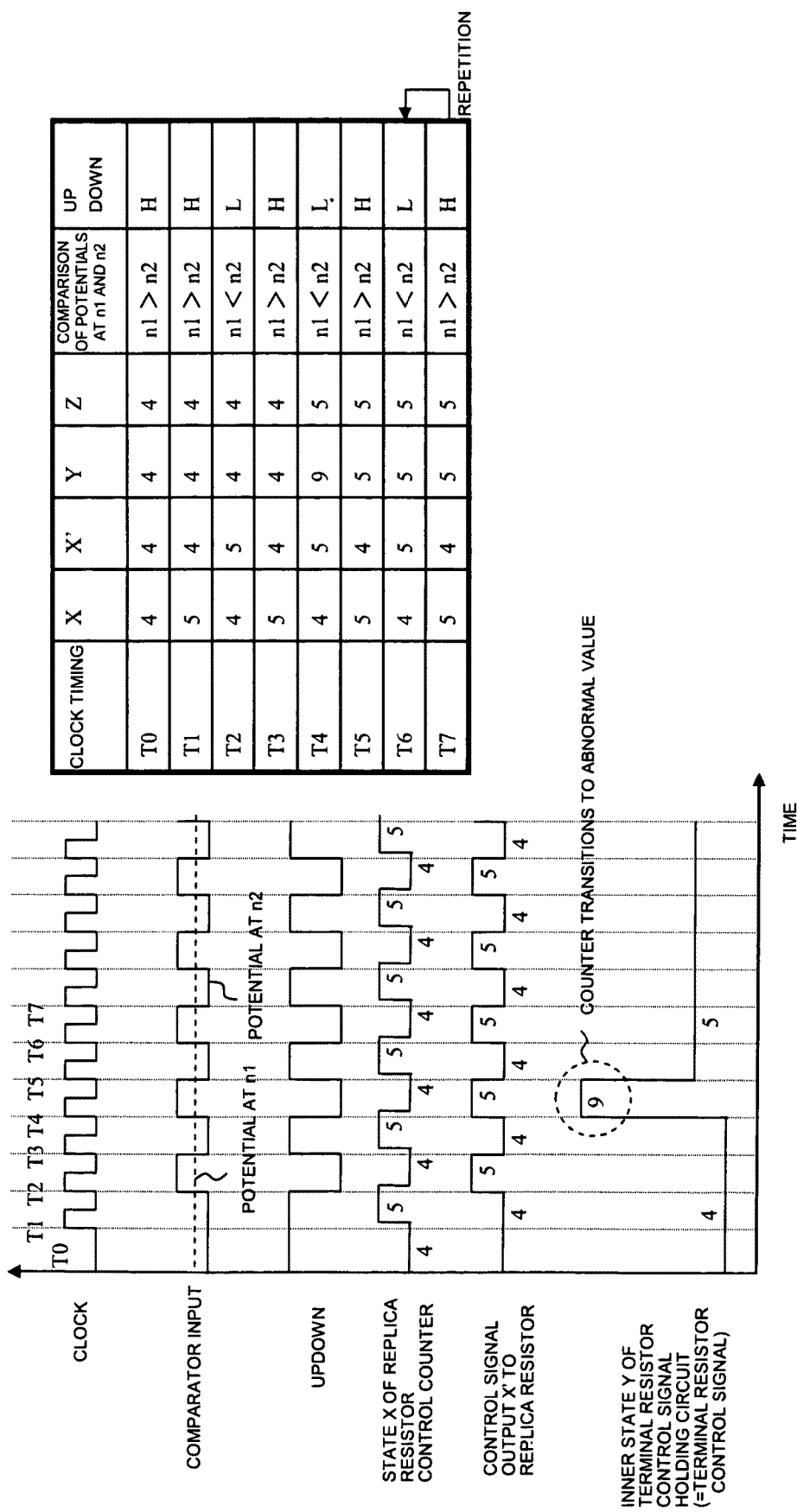

US 7,733,120 B2

IMPEDANCE ADJUSTMENT CIRCUIT

FIELD OF THE INVENTION

Reference to Related Application

This application is based upon and claims the benefit of the priority of Japanese patent application No. 2008-044382 filed on Feb. 26, 2008, the disclosure of which is incorporated herein in its entirety by reference thereto.

This invention relates to an impedance adjustment circuit. More particularly, it relates to a circuit for adjusting a resistance value of a register under adjustment to a desired value, with an external resistor as reference.

BACKGROUND ART

In signal transmission, the range of a terminal resistor at a transmitting end and at a receiving end, for example, 50 ohm ±10%, is set as a standard for impedance matching.

However, depending on absolute precision of the resistance value of a resistor element in LSI fabrication, such as ±15%, there are cases where difficulties are encountered in observing the prescribed range in designing.

Further, since the resistance value is changed with temperature or with lapse of time, there is a possibility that the resistance value of a resistance, which was within the prescribed range at ambient temperature, departs from the prescribed range at lower or higher temperatures. Hence, an impedance adjustment circuit is needed in order to keep a terminal resistor at a constant value.

The role of the impedance adjustment circuit includes a circuit comparing an external resistor with a resistor under adjustment, provided in an LSI, to control a setting code for the terminal resistor so that terminal resistor will be of a desired resistance value.

If the setting code to the resistor under adjustment is fully fixed, there is a possibility that its resistance value becomes offset with temperature, with change in the power supply voltage or with lapse of time. It is therefore necessary to monitor the resistance value for all time. In case the resistance value becomes offset from the desired value, the setting code needs to be updated automatically. However, if the setting code is changed every so often, jitter is generated in the transmission signal waveform. Thus, the setting code needs to be leveled so as not to change the setting code too frequently.

FIG. 27 shows a configuration of the impedance adjustment circuit disclosed in Patent Document 1. Referring to FIG. 27, the impedance adjustment circuit includes a comparator 1013 that compares a voltage 1011a, divided by an external resistor 1012 and a replica resistor 1011, having a variable resistance value, with a reference voltage (REFV). If it is the resistance value of the replica resistor 1011 that is larger, the divided voltage 1011a becomes lower. In this case, the comparator 1013 outputs an Up/Dn signal which is "H" (High). If conversely the replica resistor 1011 is lower, an Up/Dn signal which is "L" (Low) is output.

If the Up/Dn signal is "H", an up-down counter 1014 increments the count state at a CLK timing. If conversely the Up/Dn signal is "L", the up-down counter decrements the counter state. The counter state, expressed by three bits in the example of FIG. 27, is output to a code conversion circuit 1015 and to an averaging circuit 1016.

The code conversion circuit 1015 provides a resistor setting code, corresponding to the input counter state, to the replica resistor 1011. In the example of FIG. 27, the resistor setting code has a width of seven bits.

In a steady state, if the count value (counter state) of the up-down counter 1014 is "3", the UP/Dn signal becomes "H". The UP/Dn signal becomes "L" for the next state "4" and then reverts to the state "3". This sequence is repeated. That is, the state change shown in FIG. 29 occurs in succession.

If the state of alternate occurrences of the count values (counter states) "3" and "4" of the up-down counter 1014 is converted to a setting signal for the terminal resistor to be adjusted, and used in the so converted state, there is generated unwanted jitter in the transmission signal waveform.

The averaging circuit 1016 holds and averages past n counter states to produce the so averaged state to suppress variations in the counter state.

Referring to FIG. 28, the averaging circuit 1016 that takes an average value of the past four counter states includes three-bit synchronization circuits $1016_1$ to $1016_4$, operating circuits $1016_{21}$ to $1016_{23}$ for averaging the counter states, and a synchronization circuit $1016_{51}$ for timing adjustment.

The averaging circuit 1016 is configured so that, in case the average value of the past n counter states is such that $$X \leq \text{average value} < X+1$$

where X is an integer, X will be output, as the decimal part is truncated.

If the internal state of the up-down counter 1014 is a repetition of "3", "4" and "3" and so forth, in this order, the average value is "3.5", and a output of the averaging circuit 1016 is a constant value of "3" (see FIG. 30).

In similar manner, if the inner state of the up-down counter 1014 is a repetition of "3", "4", "5", "4", "3" and so forth, in this order, the average value is "4". The output of the averaging circuit 1016 is a constant value of "4" (see FIG. 32).

This stable state signal is delivered to another code conversion circuit 1017 which generates a setting signal to a terminal resistor as a target for adjustment. Since the state signal delivered is stabilized by the averaging circuit 1016, the setting signal output may be freed of variations.

[Patent Document 1] JP Patent Kokai Publication JP-P2004-32721A

SUMMARY

The entire disclosure of Patent Document 1 is incorporated herein by reference thereto. The following analysis of the related art is given by the present invention.

If, in the configuration shown in FIG. 27, the replica resistor 1011 is fully of a desired value in the count state 4, that is, with the count value of 4, the divided voltage 1011a is fully coincident with the reference voltage REFV. At this time, the UP/Dn output is indefinite, such that it may not be known which of the states "3" and "5" will be assumed by the UP/Dn output as the next state.

That is, the state of the up-down counter 1014 is irregularly varied within a range of the states (count values) of from "3" and "5", as shown in FIG. 33. If past four values of these count values are averaged by the averaging circuit 1016, the averaged output is changed between "3" and "4", such that the resistor setting code may not be stabilized.

Since the averaging circuit 1016 has to hold and operate on the past four state hysteresis, it is necessary to provide a number of synchronization circuits ($1016_1$ to $1016_4$ and $1016_{51}$), as shown in FIG. 28, thus increasing the circuit size.

If, in the averaging circuit, shown in FIG. 28, past N states, each represented by m bits, are averaged, m×(N+2) synchronization circuits (flip-flops) are needed.

The present invention seeks to solve one or more of the above problems and may be summarized substantially as follows:

According to the present invention, there is provided an impedance adjustment circuit which compares a first resistor with a resistor under adjustment and makes adjustment so that the resistor under adjustment will be of a predetermined resistance value. In the impedance adjustment circuit, there are provided a comparator that compares a resistance value of a first resistor and a resistance value of a replica resistor that forms a replica of the resistor under adjustment; a replica resistor control counter that counts up or down based on a result of comparison by the comparator to produce a control signal that variably controls the resistance value of the replica resistor; a resistor-under-adjustment control signal holding circuit that holds a control signal that variably controls the resistance value of the resistor under adjustment; and a monitor circuit that receives a state of the replica resistor control counter and an output of the resistor-under-adjustment control signal holding circuit and that delivers an output of the resistor-under-adjustment control signal holding circuit to the resistor-under-adjustment control signal holding circuit in case the difference between the state of the replica resistor control counter and the output of the resistor-under-adjustment control signal holding circuit is within a preset range.

According to the present invention, in case the difference between the state of the replica resistor control counter and the output of the resistor-under-adjustment control signal holding circuit is outside the preset range, the monitor circuit outputs to the resistor-under-adjustment control signal holding circuit a value corresponding to the state of the replica resistor control counter plus or minus a preset value depending on the difference between the state of the replica resistor control counter and the output of the resistor-under-adjustment control signal holding circuit. According to the present invention, the monitor circuit includes: a subtracter, an adder, a first selector, and a second selector. The subtracter subtracts 1 from the state of the replica resistor control counter to output the subtraction result in case the difference between the state of the replica resistor control counter and the output of the resistor-under-adjustment control signal holding circuit is not less than a preset first value. The adder adds 1 to the state of the replica resistor control counter to output the addition result in case the difference between the state of the replica resistor control counter and the output of the resistor-under-adjustment control signal holding circuit is less than a preset second value. The first selector receives an output of the subtracter and an output of the adder and selects, in case the difference between the state of the replica resistor control counter and the output of the resistor-under-adjustment control signal holding circuit is not less than the first value, selects the output of the subtracter; the first selector selecting and outputting the output of the adder in case the difference is less than the first value. The second selector receives an output of the first selector and the output of the resistor-under-adjustment control signal holding circuit and selects and outputs the output of the resistor-under-adjustment control signal holding circuit in case the difference between the state of the replica resistor control counter and the output of the resistor-under-adjustment control signal holding circuit is within the preset range; the second selector selecting an output of the first selector and outputting the output selected to the resistor-under-adjustment control signal holding circuit in case the difference is outside the preset range.

The replica resistor control counter includes a decision section that checks overflow or underflow, an adder, a selector and a holding circuit. The adder adds −1 to the result of comparison by the comparator if the result of comparison is of a first value, while adding 1 to the result of comparison by the comparator if the result of comparison is of a second value. The selector receives an output of the adder, an output of the resistor-under-adjustment control signal holding circuit and the result of decision by the decision section. The selector selects an output of the resistor-under-adjustment control signal holding circuit if the result of addition by the adder indicates an overflow or an underflow, while selecting an output of the adder if otherwise. The resistor-under-adjustment control signal holding circuit receives and holds an output of the selector.

According to the present invention, the number of the synchronization circuit may be smaller than that of the related technique to reduce the circuit size.

According to the present invention, it is possible to have the setting code for the resistor under adjustment not changed as long as the state change in the replica resistor control counter is within a preset range.

According to the present invention, the resistance value may converge automatically to a new optimum value even in case the resistance value is changed e.g. with temperature. Moreover, self-restoration to a normal state is possible even in case the state of the resistor-under-adjustment control signal holding circuit has become of an abnormal value e.g., due to noise.

According to the present invention, in case there is a fixed error, such as an error in the wiring resistance, in the terminal resistor (terminal resistor) or in the replica resistor, it is possible to give an offset to the code conversion circuit.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a tabulated diagram for illustrating the operation of a code conversion circuit of Example 1 of the present invention.

FIG. 6A is a timing chart for illustrating the operation in case of temperature increase in Example 1 of the present invention, and FIG. 6B is a tabulated diagram for illustrating the operation in case of temperature increase in Example 1 of the present invention.

FIG. 7A is a timing chart for illustrating the self-restoration operation in Example 1 of the present invention, and FIG. 7B is a tabulated diagram for illustrating the self-restoration operation in Example 1 of the present invention.

PREFERRED MODES OF THE INVENTION

Figure 1:
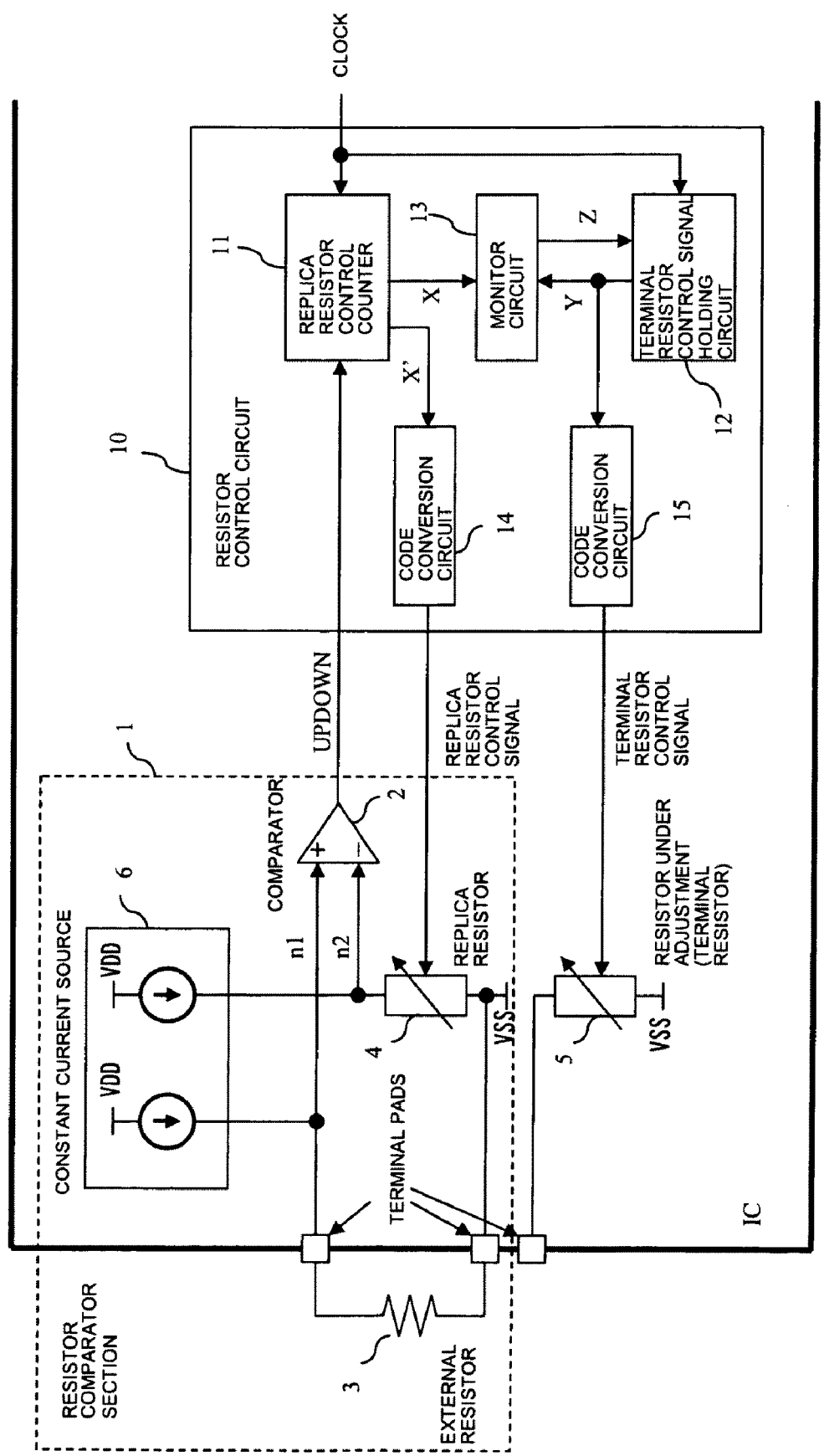
FIG. 1 is a circuit diagram showing a configuration of an Example 1 of the present invention.

Reference is now made to the accompanying drawings for illustrating the present invention in further detail. In an impedance adjustment circuit according to the present invention, resistance values of an external resistor and a resistor under adjustment (5) (terminal resistor) are compared to each other to control a code signal to be set for the resistor under adjustment (5). Referring to FIG. 1, in the impedance adjustment circuit according to the present invention, there are provided a replica resistor control counter (11), a resistor-under-adjustment control signal holding circuit (12) and a monitor circuit (13) that compares the inner state of the replica resistor control counter (11).

The replica resistor control counter (11) counts up and down, based on the result of comparison by a comparator (2) that compares the terminal voltages of an external resistor (3) and a replica resistor (4) of the resistor under adjustment (5), to produce a signal (X') that variably controls the resistance value of the replica resistor (4). The signal (X') from the replica resistor control counter (11) is code-converted by a code conversion circuit (14) and thence supplied to the replica resistor (4).

The resistor-under-adjustment control signal holding circuit (12) holds a signal (Y) used for variably controlling the resistance value of the resistor under adjustment (5). The signal (Y) is code-converted by the code conversion circuit (15) and thence supplied to the resistor under adjustment (5).

The monitor circuit (13) receives the state of the replica resistor control counter (11) (a count value X) and the output (Y) of the resistor-under-adjustment control signal holding circuit (12). In case a difference between the state (X) of the replica resistor control counter (11) and an output (Y) of the resistor-under-adjustment control signal holding circuit (12) is within a preset range ($|X-Y| \leq n$), where n is a preset integer, the monitor circuit (13) delivers the output (Y) of the resistor-under-adjustment control signal holding circuit (12) as an input (Z) to the resistor-under-adjustment control signal holding circuit (12).

In case the difference between the state of the replica resistor control counter (11) (a count value X) and the output (Y) of the resistor-under-adjustment control signal holding circuit (12) is outside a preset range ($|X-Y| > n$), the monitor circuit (13) outputs a value corresponding to the state (X) of the replica resistor control counter (11) minus or plus a preset value to the resistor-under-adjustment control signal holding circuit (12), in dependence upon a difference between the state (X) of the replica resistor control counter (11) and the output (Y) of the resistor-under-adjustment control signal holding circuit (12), for example, in dependence upon whether or not $(X-Y) \geq (n+1)$ holds.

Figure 2:
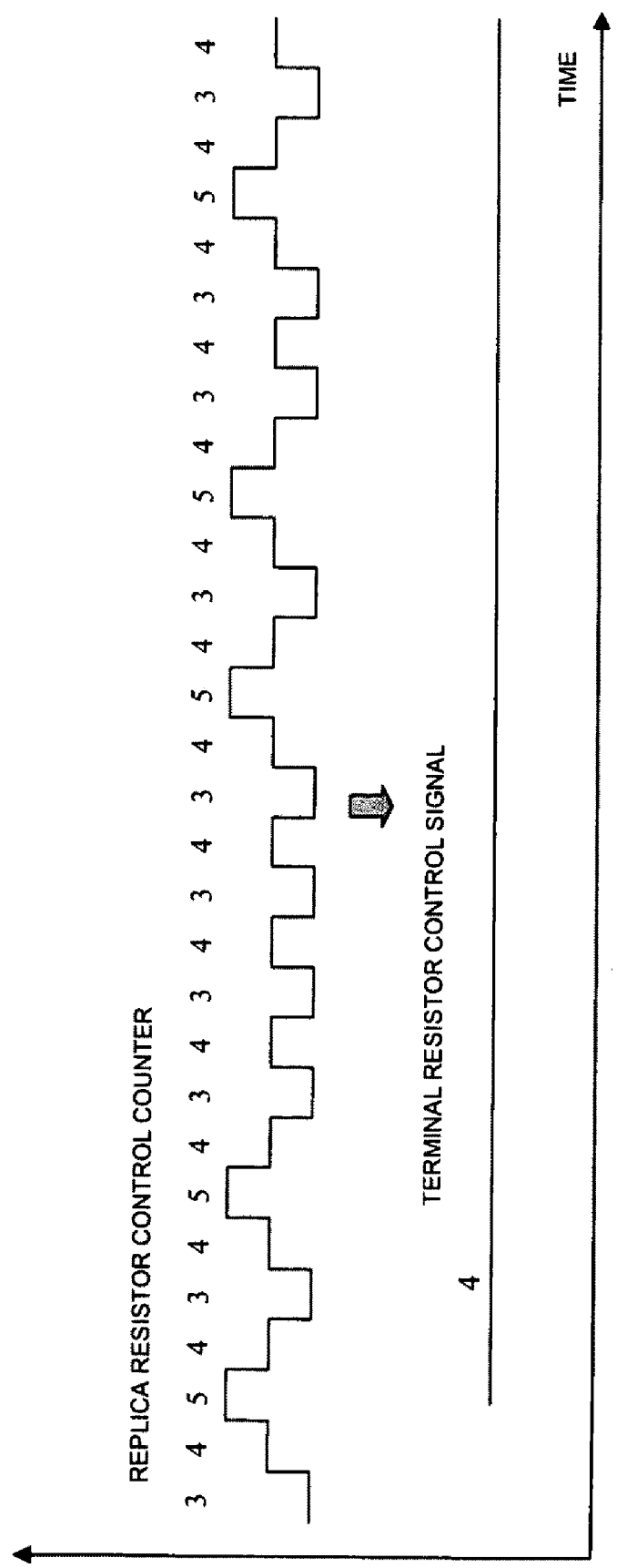
FIG. 2 is a waveform diagram for illustrating the operation of Example 1 of the present invention.

The monitor circuit (13) performs control so that the control code to the resistor under adjustment (5) is not updated in case the difference between the state (X) of the replica resistor control counter (11) and the output (Y) of the resistor-under-adjustment control signal holding circuit (12) is within a preset range, such as within ±1. By so doing, even though the state of the replica resistor control counter (11) is varied within the range of three states, the state of the resistor-under-adjustment control signal holding circuit (12) is not changed, as shown in FIG. 2, and hence the control code to the resistor under adjustment (5) is not varied. The present invention will now be described with reference to several Examples.

EXAMPLE 1

FIG. 1 shows a configuration of an impedance adjustment circuit according to an Example 1 of the present invention. This impedance adjustment circuit includes a resistor comparator section 1, a resistor control circuit 10 and a resistor under adjustment (terminal resistor) 5.

The resistor comparator section 1 includes an external resistor 3 of a variable resistance value, a replica resistor 4, a constant current source 6 and a comparator 2. The replica resistor 4 is a resistor which is a replica of the resistor under adjustment (terminal resistor) 5. The constant current source 6 supplies the current to the replica resistor 4. The comparator 2 compares the terminal voltage of the external resistor 3, generated by supplying the current to the external resistor 3, with the terminal voltage of the replica resistor 4, generated by supplying the current to the replica resistor 4, that is, compares the potential at n1 to that at n2. Though no limitation is imposed on the present invention, the external resistor 3 is externally connected to a semiconductor device (LSI) at the time of the operation for impedance adjustment.

The resistance values of the replica resistor 4 and the resistor under adjustment (terminal resistor) 5 are made variable by a control signal for controlling the replica resistor and by a control signal for controlling the resistor under adjustment, respectively. The replica resistor 4 and the resistor under adjustment (terminal resistor) 5 may be composed by variable resistance circuits shown in one of FIGS. 21 to 26, for instance.

Figure 21:
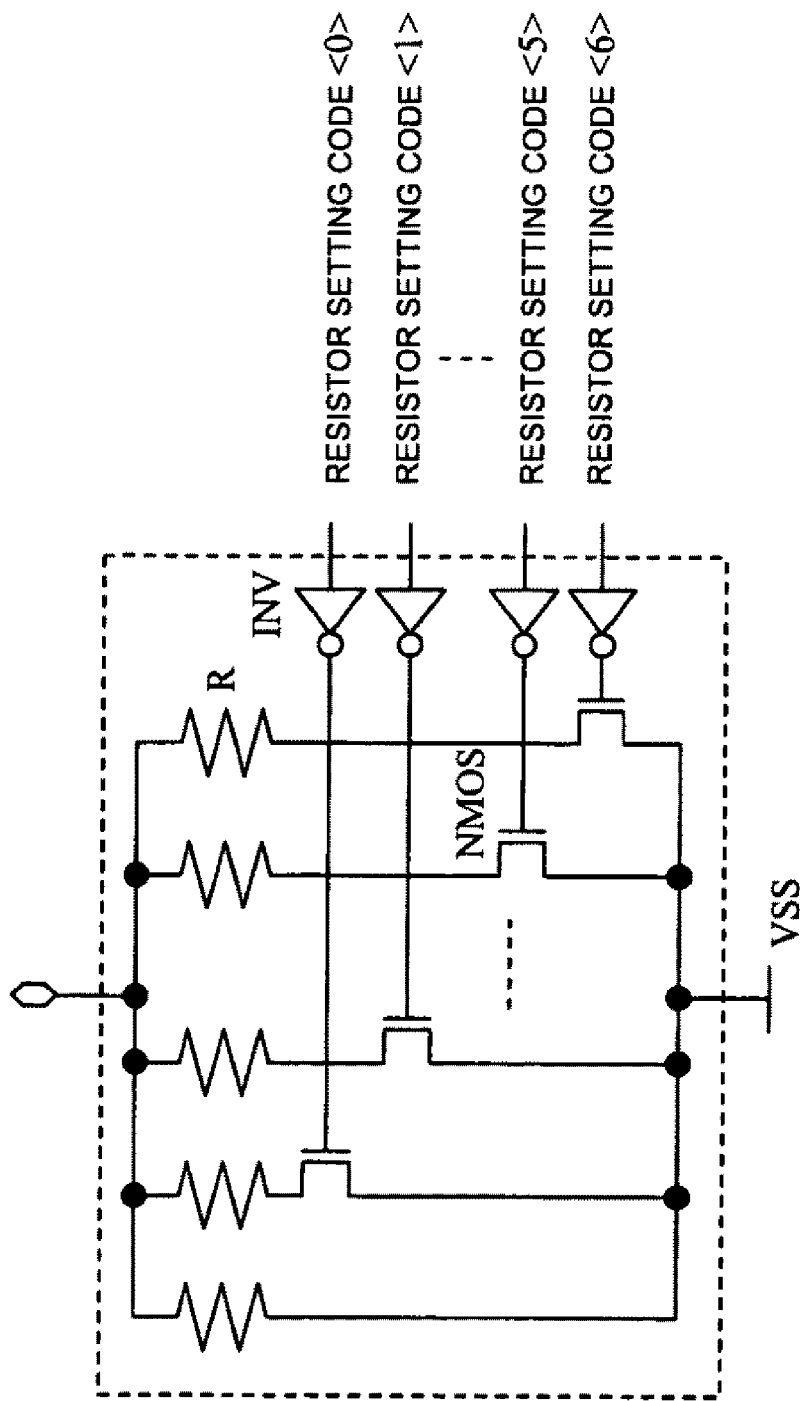
FIGS. 21 to 26 are circuit diagrams showing respective instances of configurations of a variable resistance used in the Examples of the present invention.
Figure 22:
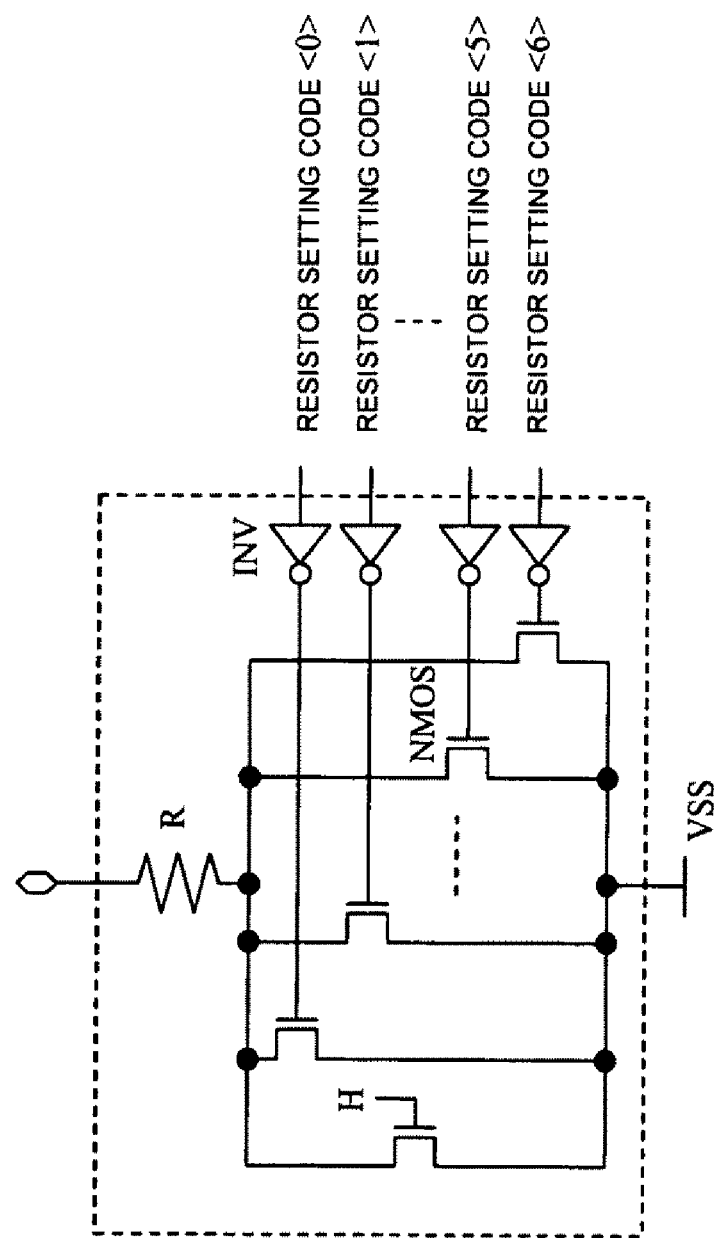

FIGS. 21 and 22 show examples of the circuits with variable resistance values. These circuits are connected to VSS and adopt nMOS transistors as switches.

The example shown in FIG. 21 includes seven NMOS transistors and eight resistors R. NMOS transistors have sources connected in common to VSS, while having drains connected to one ends of the associated seven resistors R, respectively. The gates of the NMOS transistors are supplied with signals obtained by inverting the resistor setting codes <0> to <6> by inverters INV, respectively. The remaining resistor R has one end connected to VSS. The opposite ends of the eight resistors R are connected in common to VDD.

The example shown in FIG. 22 includes seven NMOS transistors having sources connected in common to VSS and drains connected in common to one end of a resistor R, and another NMOS transistor having a source connected to VSS and a gate supplied with a High level. The gates of the seven NMOS transistors are supplied with signals obtained by inverting the resistor setting codes <0> to <6> by inverters INV, respectively. The drains of the eight NMOS transistors are connected in common to one end of the resistor R.

Figure 23:
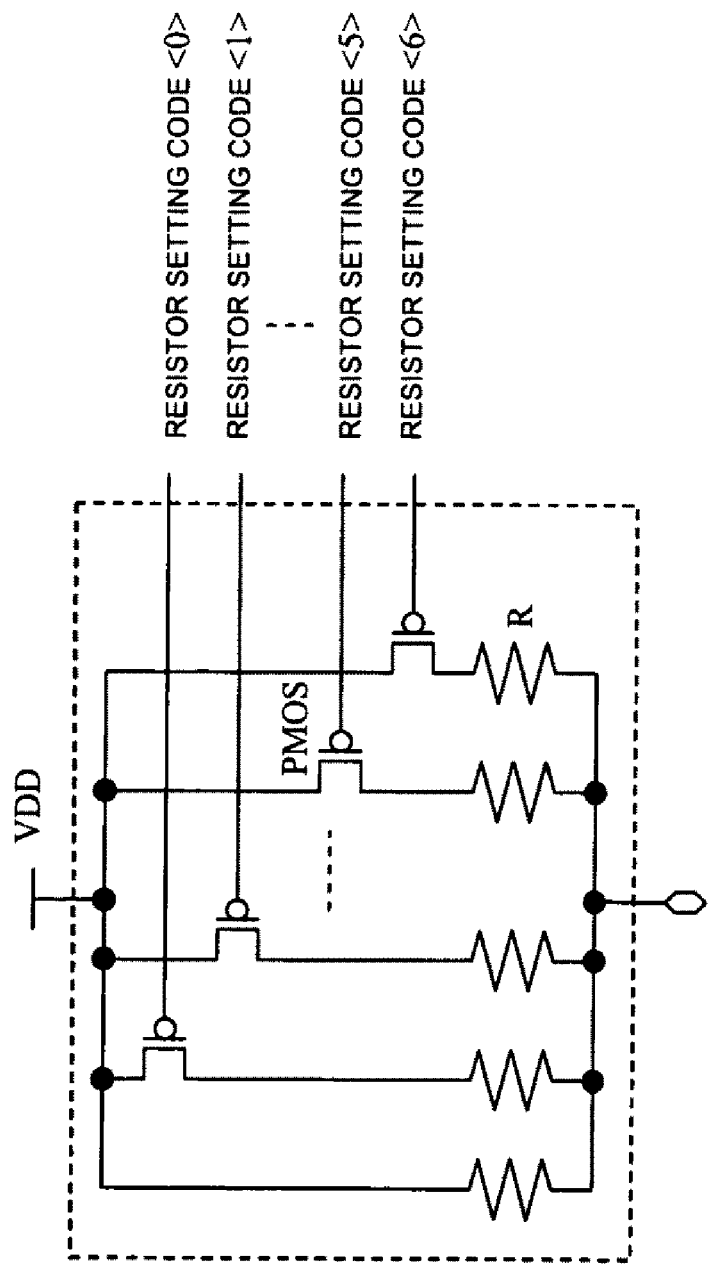
Figure 24:
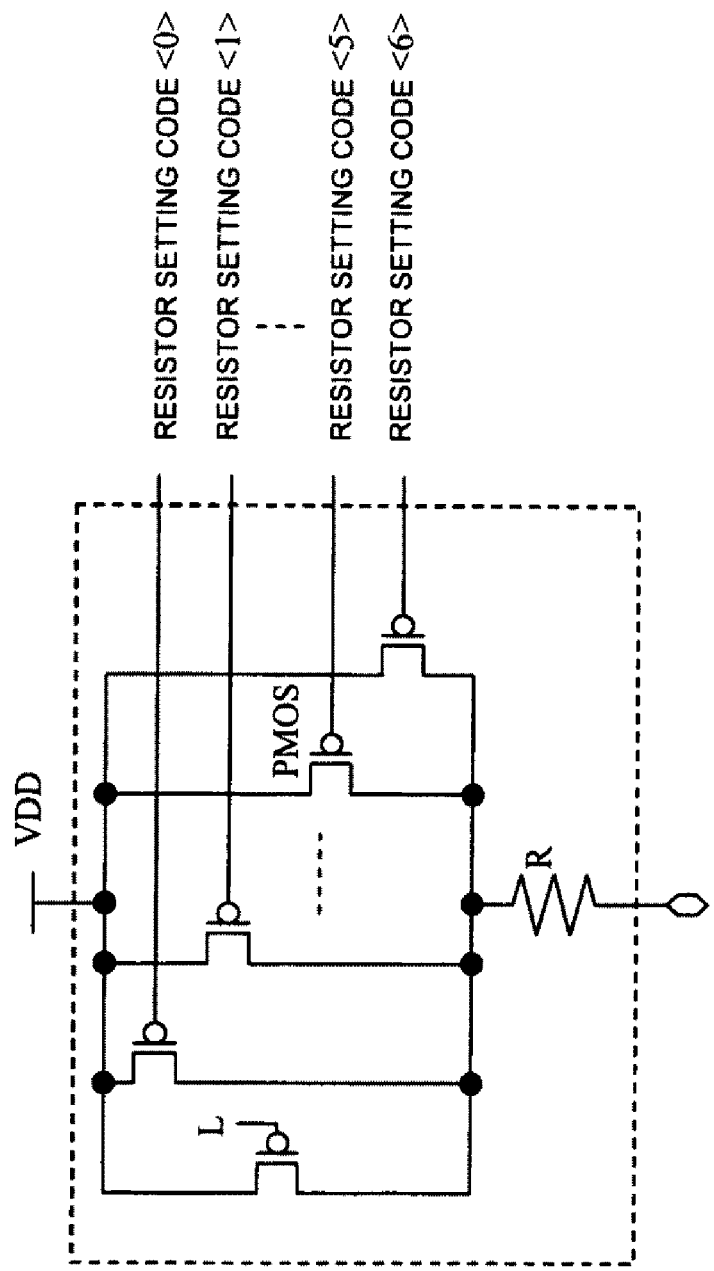

FIGS. 23 and 24 depict examples of a variable resistance circuit connected to VDD and which uses a number of PMOS switches. The example shown in FIG. 23 includes seven PMOS transistors and eight resistors R. The pMOS transistors have sources connected in common to VDD and drains connected to one ends of the seven resistors R, respectively. The gates of the PMOS transistors are connected to resistor setting codes <0> to <6>, respectively. The opposite ends of the eight resistors R are connected in common to VSS.

The example shown in FIG. 24 includes seven PMOS transistors having sources connected in common to VDD and having gates connected to resistor setting codes <0> to <6>, respectively. The example shown in FIG. 24 also includes another PMOS transistor having a source connected to VDD and a gate supplied with a Low level. The drains of the eight PMOS transistors are connected in common to one end of a resistor R.

Figure 25:
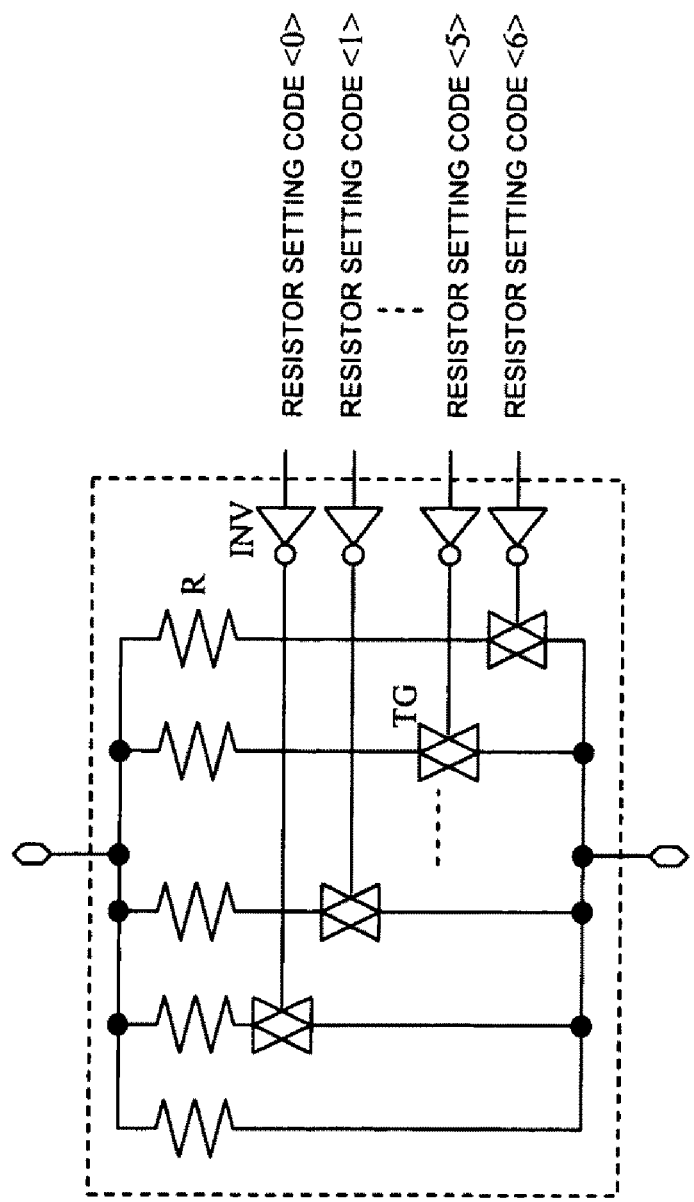
Figure 26:
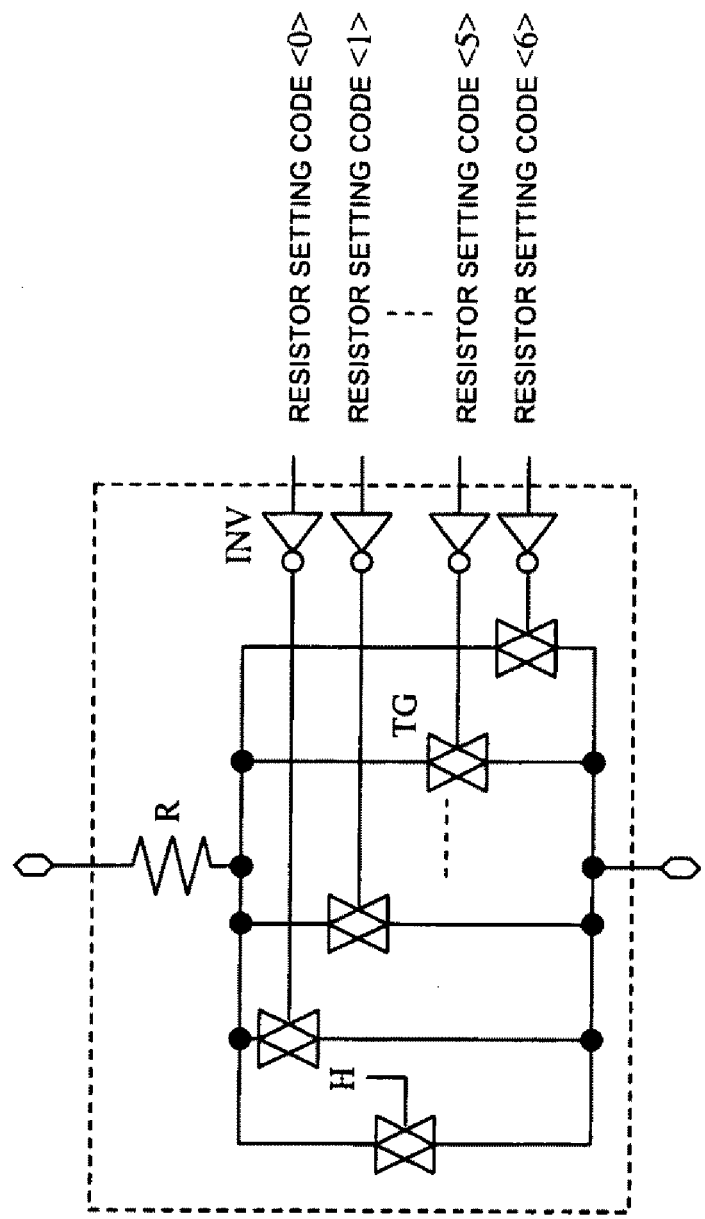

In Examples shown in FIGS. 25 and 26, transfer gates are used as switches. The variable resistance circuits, shown in FIGS. 25 and 26, are used for line-to-line termination at a voltage level close to VDD/2.

The example shown in FIG. 25 includes seven CMOS transfer gates TG, each of which is made up of a PMOS transistor and an NMOS transistor, and eight resistors R, seven of which are connected in series with the CMOS transfer gates. Each CMOS transfer gate has one end connected in common while having the other end connected to one end of each of seven of the resistors R. To the gates of the CMOS transfer gates, there are supplied resistor setting codes <0> to <6> and inverted signals thereof via inverters INV. The other ends of the eight resistors R are connected in common to VDD.

The example shown in FIG. 26 includes eight CMOS transfer gates TG, having one ends connected in common and having the other ends connected in common to one end of a resistor R. Each CMOS transfer gate TG is made up of a PMOS transistor and an NMOS transistor. To the gates of the seven CMOS transfer gates TG, there are supplied resistor setting codes <0> to <6> and inverted signals thereof by inverters INV. To the gates of the NMOS transistor and the PMOS transistor of each of the eighth transfer gate are supplied High and Low levels, respectively.

In the Examples of FIGS. 21 to 26, all of the transistors or the transfer gates are turned on when seven-bits of the control signal (resistor setting codes <0> to <6>) are all "L", with the resistance values being then lowest. The resistance values are designed to be increased or decreased monotonously with changes in the control signal. In the Examples of FIGS. 21 to 26, the transistors are turned off one by one by increasing the number of the "H" bits one by one, thereby allowing the resistance value to be increased monotonously.

Referring again to FIG. 1, the comparator 2 delivers the result of comparison of the terminal voltage of the external resistor 3 (potential at n1) with the terminal voltage of the replica resistor 4 (potential at n2), that is, the large/small relationship of the external resistor 3 and the replica resistor 4, as an UP-DOWN signal to the resistor control circuit 10.

For example, if, with the current supplied from the constant current source 6 to the external resistor 3 being equal to the same current supplied to the replica resistor 4, the external resistor 3 is larger than the replica resistor 4 (external resistor 3>replica resistor 4), the potential at n1 is higher than that at n2 (potential at n1>potential at n2). Hence, the value of the UPDOWN output from the comparator 2 is "H".

If conversely the external resistor 3 is smaller than the replica resistor 4 (external resistor 3<replica resistor 4), the potential at n1 is lower than that at n2 (potential at n1<potential at n2). Hence, the value of the UPDOWN output from the comparator 2 is "L".

If the resistance value of the replica resistor 4 is to be adjusted to n times the resistance of the external resistor 3, it is sufficient to set the current value of the current supplied to the replica resistor 4 from the constant current source 6 to one-n-th of the current value of the current supplied to the external resistor 3.

Figure 3:
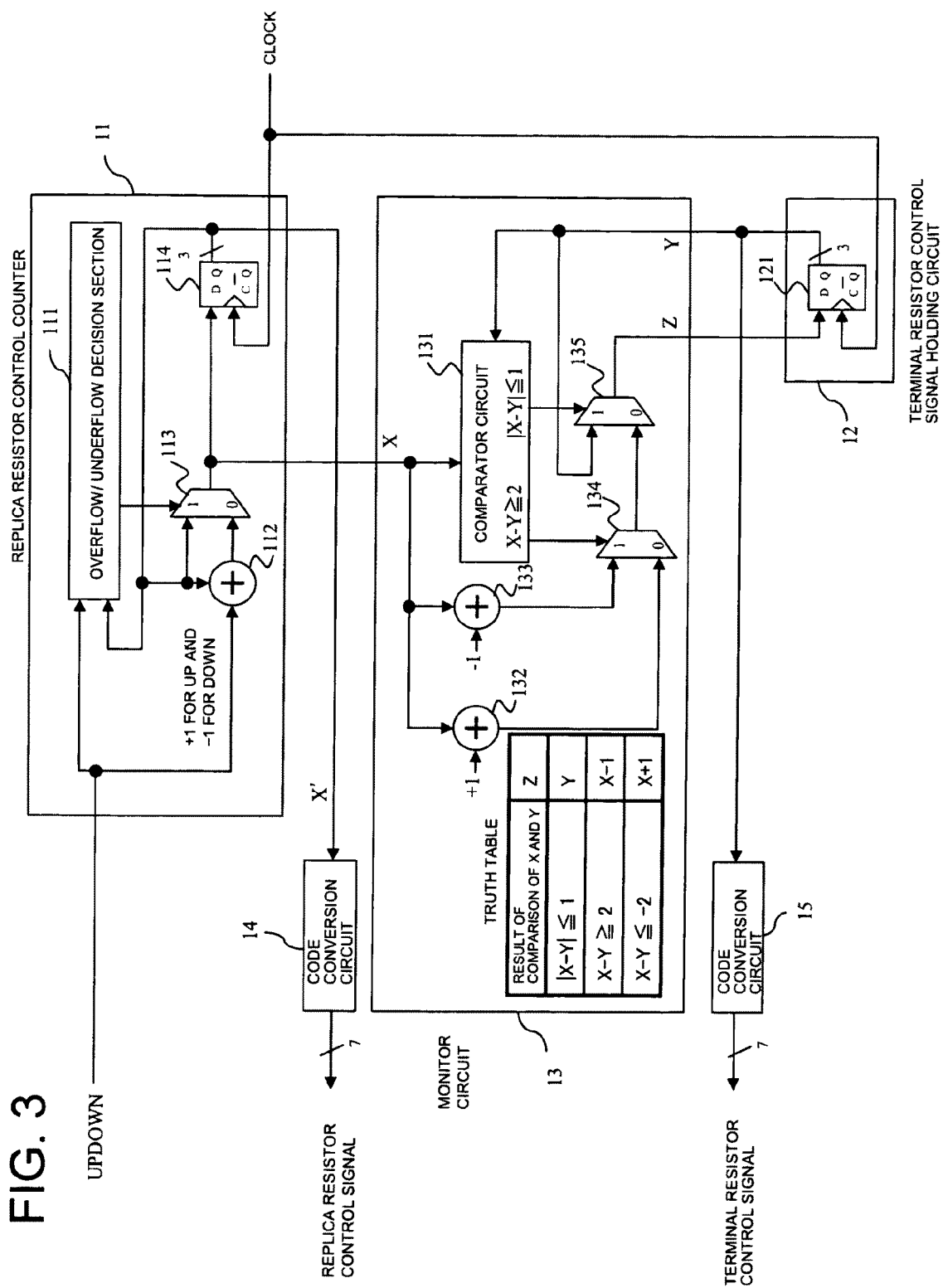
FIG. 3 is a circuit diagram showing a configuration of a resistor control circuit of Example 1 of the present invention.

FIG. 3 shows an instance of a configuration of the resistor control circuit 10 of FIG. 1 in greater detail. The resistor control circuit 10 generates, from the UPDOWN signal, a setting code for the replica resistor 4 and a setting code for the resistor under adjustment (terminal resistor) 5.

The resistor control circuit 10 includes a replica resistor control counter 11, a resistor-under-adjustment control signal holding circuit 12, a monitor circuit 13, and code conversion circuits 14 and 15. The code conversion circuits 14 and 15 convert state signals X' and Y, output from the replica resistor control counter 11 and the resistor-under-adjustment control signal holding circuit 12, respectively, into respective resistor setting codes.

The replica resistor control counter 11 and the resistor-under-adjustment control signal holding circuit 12 may each be constituted by a binary counter or a gray code counter. The gray code counter has a merit that, since the number of flip-flops that come into operation at a time is one, there is generated only small noise.

The replica resistor control counter 11 is composed by an up-down counter that updates the inner state in the UP direction and in the DOWN direction, if, at a clock input timing, the UPDOWN signal is "H" and "L", respectively.

The replica resistor control counter 11 includes an inner state overflow/underflow decision section 111, an adder 112, a selector 113 and three-bit flip-flops (register) 114. If the UPDOWN signal is "H" (for UP), the adder 112 outputs a three-bit count output of the flip-flops 114 incremented by one (+1). If the UPDOWN signal is "L" (for DOWN), the adder 112 outputs the three-bit count output of the flip-flops 114 decremented by one (−1). In the absence of an overflow or an underflow, the selector 113 selects an output of the adder 112, with the flip-flops 114 then sampling an output of the selector 113 with a rising clock edge.

In case the occurrence of an overflow or an underflow is detected by the inner state overflow/underflow decision section 111, the selector 113, receiving the result of detection by the inner state overflow/underflow decision section 111 as a selection control signal, selects and delivers an output (current value) of the resister (three-bit flop-flops) 114. As a result, the counter state (count value) of the resister 114 is held at the then prevailing maximum or minimum value. For example, if the inner state of the counter 11 is zero, with an output of the resister 114 then being zero, the inner state is kept at 0 even though UPDOWN="L" is delivered as input. If conversely the inner state of the counter 11 is a maximum value, with the output of the register 114 then being "111", and DOWN="H" is delivered as input, the inner state is kept at the maximum value. The output X' (three-bit output) of the register 114 composed by the three-bit flip-flops, are delivered to the overflow/underflow decision section 111, adder 112 and to the code conversion circuits 14 and 15.

The resistor-under-adjustment control signal holding circuit 12 holds a state signal (Z), supplied from the monitor circuit 13, until the next clock is delivered thereto. The resistor-under-adjustment control signal holding circuit 12 includes three-bit flip-flops 121.

The monitor circuit 13 compares a state X of the replica resistor control counter 11 (an output of the selector 113) to a state signal Y retained by the resistor-under-adjustment control signal holding circuit 12. The monitor circuit then outputs a state signal Z, related to the result of comparison, to the resistor-under-adjustment control signal holding circuit 12. The state signal Y, held by the resistor-under-adjustment control signal holding circuit 12, is delivered to the code conversion circuit 15 as input.

The monitor circuit 13 is configured so that, if the state difference between X and Y is within a preset range, such as within the range of ±1, $Z=Y$ if $|X-Y|\leq 1$, $Z=X-1$ if $X-Y\geq 2$, and $Z=X+1$ if $X-Y\leq -2$ in order not to change the state signal Y output by the resistor-under-adjustment control signal holding circuit 12 for the preset state difference between X and Y, such as difference within ±1. This is indicated as a truth table in association with the monitor circuit 13 shown in FIG. 3.

The monitor circuit 13 includes a comparator circuit 131, adders 132 and 133, and selectors 134 and 135. The comparator circuit 131 receives the signals X and Y to verify whether the states of the signals are such that $X-Y\geq 2$ or $|X-Y|\leq 1$.

The selector 134 selects, based on the result of comparison by the comparator circuit 131, the output (X−1) of the adder 133 for $X-Y\geq 2$. If otherwise, the selector selects the output (X+1) of the adder 132.

Based on the result of comparison by the comparator circuit 131, the selector 135 selects Y for $|X-Y|\leq 1$, while selecting an output of the selector 134 otherwise. The output Z of the selector 135 is delivered to the resistor-under-adjustment control signal holding circuit 12 and sampled by the flip-flop 121 in response to the rising clock edge so as to be output as the state signal Y.

The code conversion circuits 14 and 15 convert the binary code into the thermometer code, as indicated by the truth table shown in FIG. 4.

The code conversion circuits 14 and 15 are connected to the replica resistor control counter 11 and to the resistor-under-adjustment control signal holding circuit 12, respectively. Output signals of the code conversion circuits 14 and 15 are to be resistor setting codes for the replica resistor 4 and for the resistor under adjustment 5, respectively.

If the impedance adjustment circuit, shown in FIG. 1, is constructed for the state represented by m bits, the number of the synchronization circuits (flip-flops) needed is m×2. These are m bit flip-flops 114 of the replica resistor control counter 11 and m bit flip-flops 121 of the resistor-under-adjustment control signal holding circuit 12, totaling at 2×m.

Figure 27:
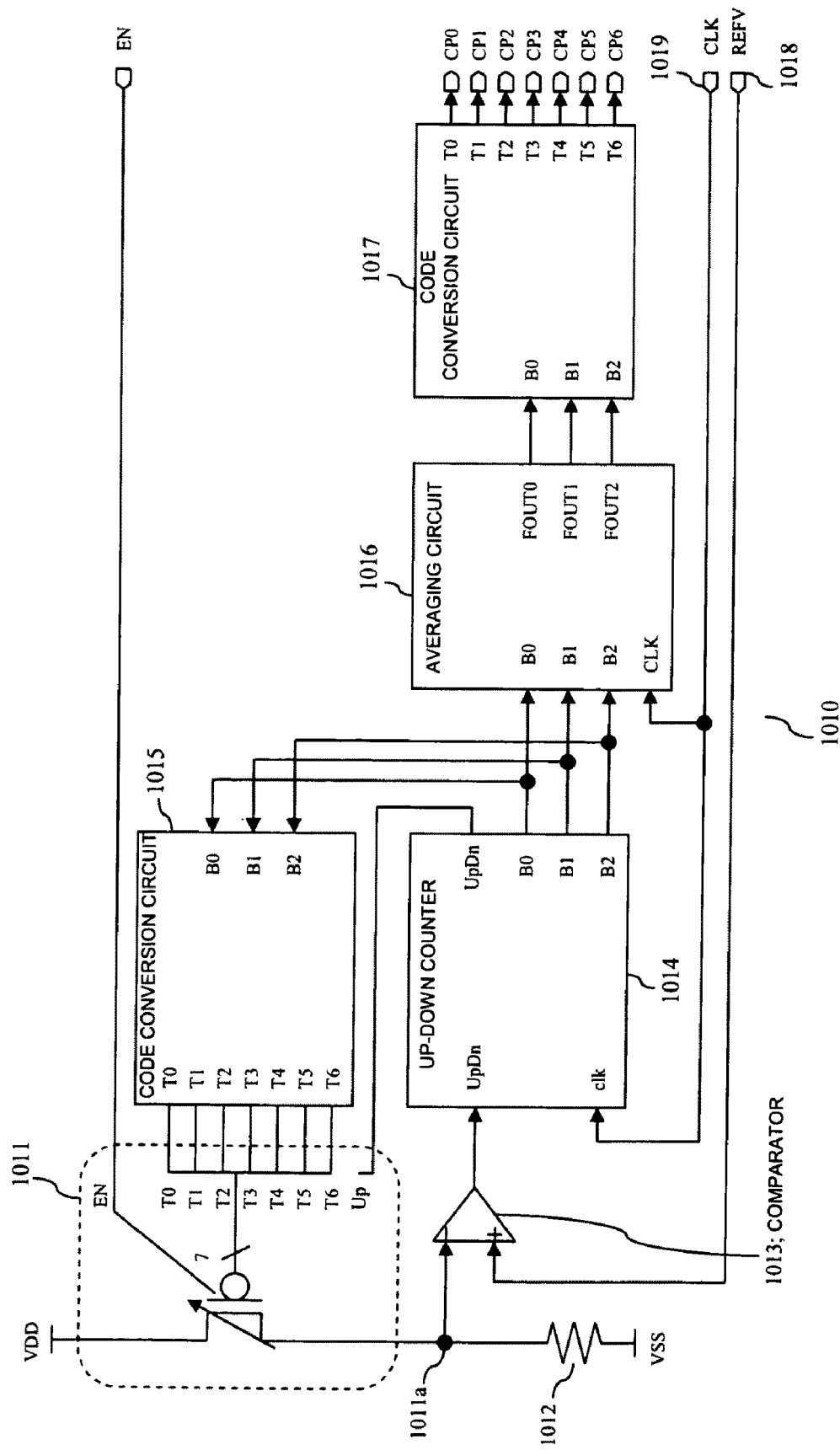
FIG. 27 is a circuit diagram showing a configuration of an impedance adjustment circuit of the related technique.
Figure 28:
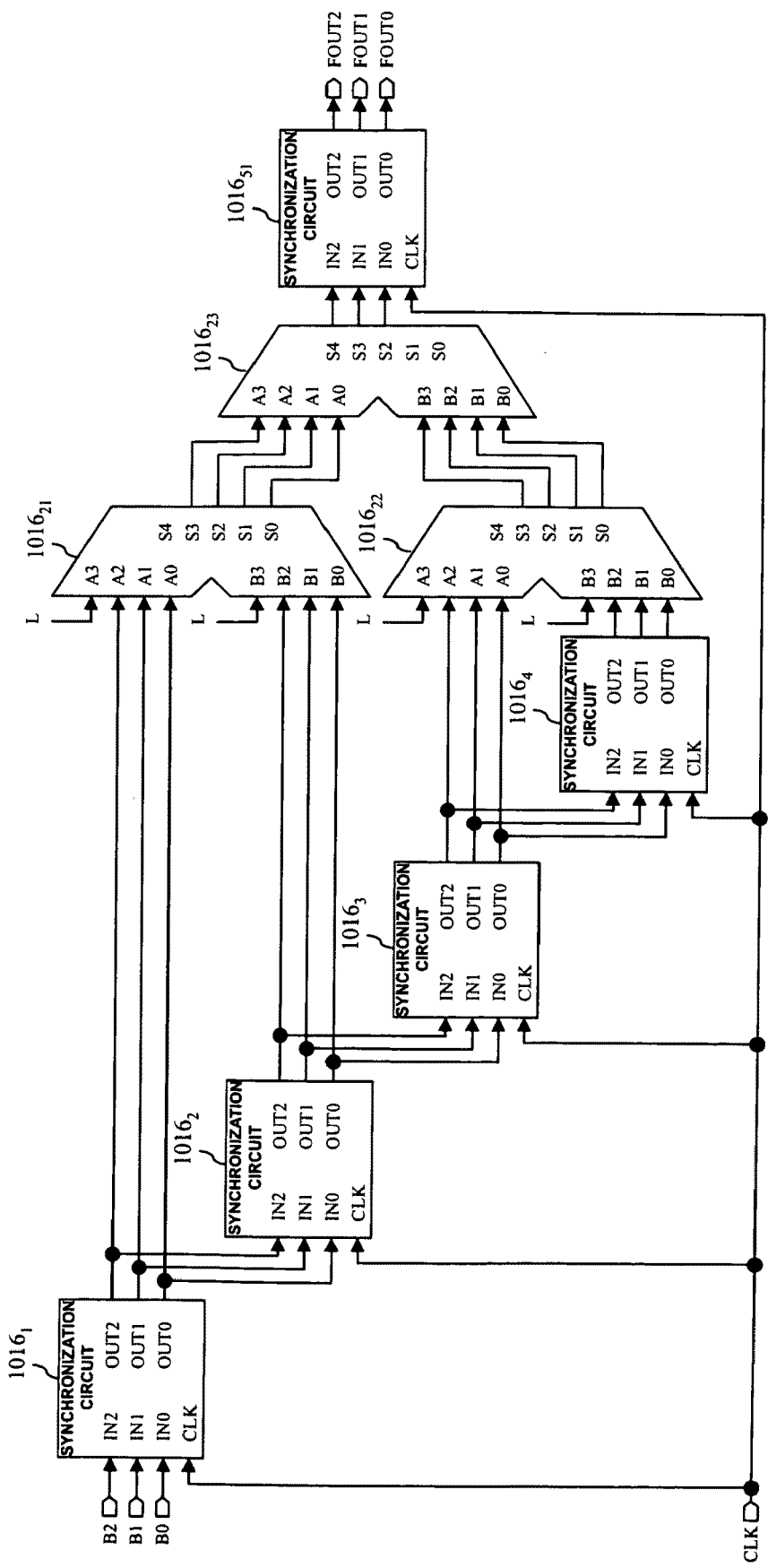
FIG. 28 is a circuit diagram showing a configuration of an averaging circuit used in FIG. 27.
Figure 29:
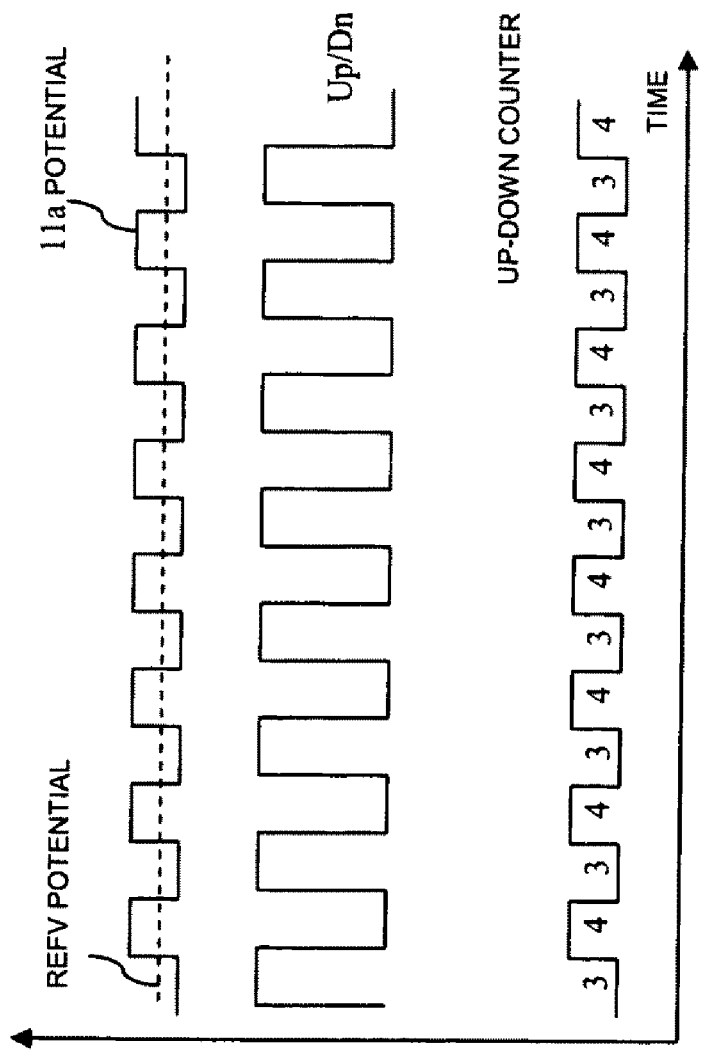
FIG. 29 is a waveform diagram showing a typical operation of an up-down counter of FIG. 27 in case the potential is converging with repetition of two alternating states.
Figure 30:
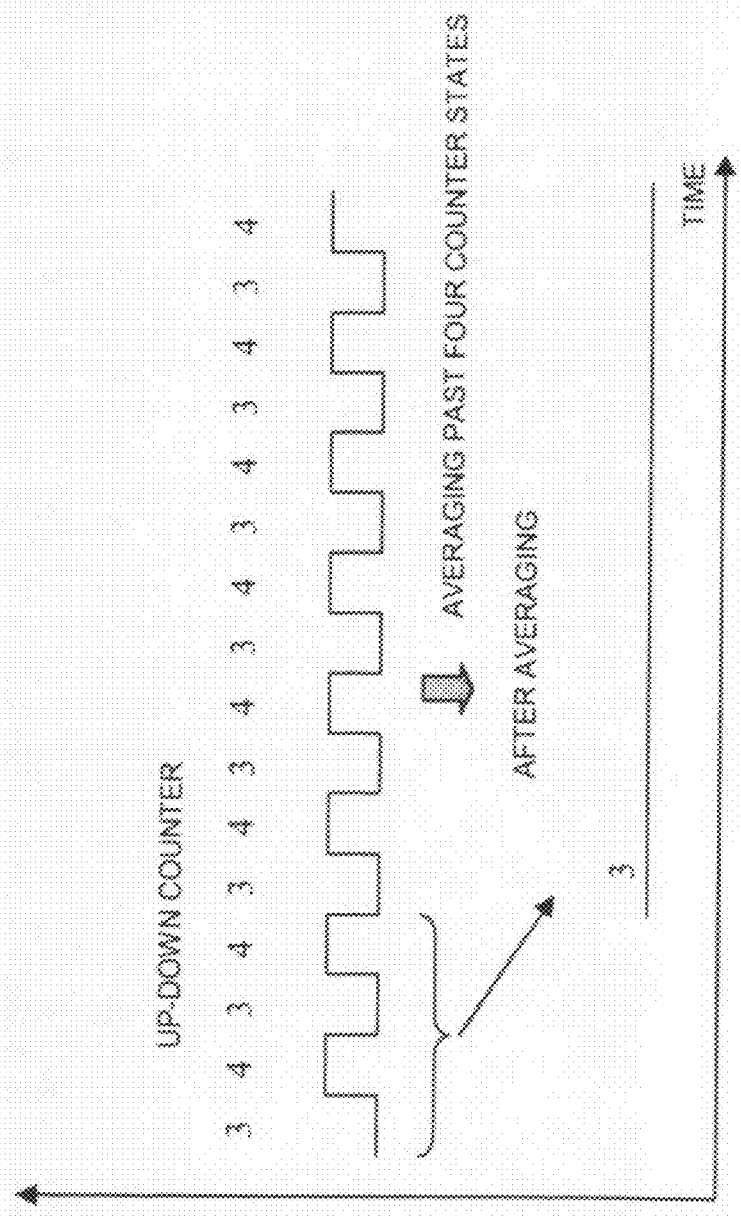
FIG. 30 is a graph showing outputs of the averaging circuit in the up-down counter operation shown in FIG. 29.
Figure 31:
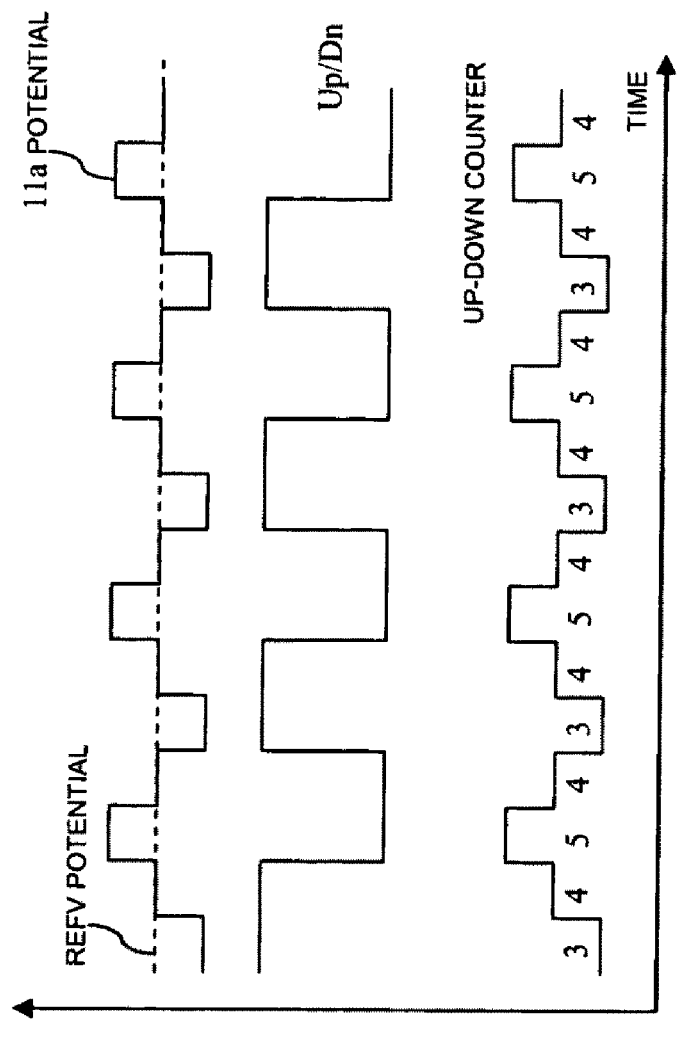
FIG. 31 is a waveform diagram showing the up-down counter operation of FIG. 27 in case the potential is converging with repetition of three alternating states.
Figure 32:
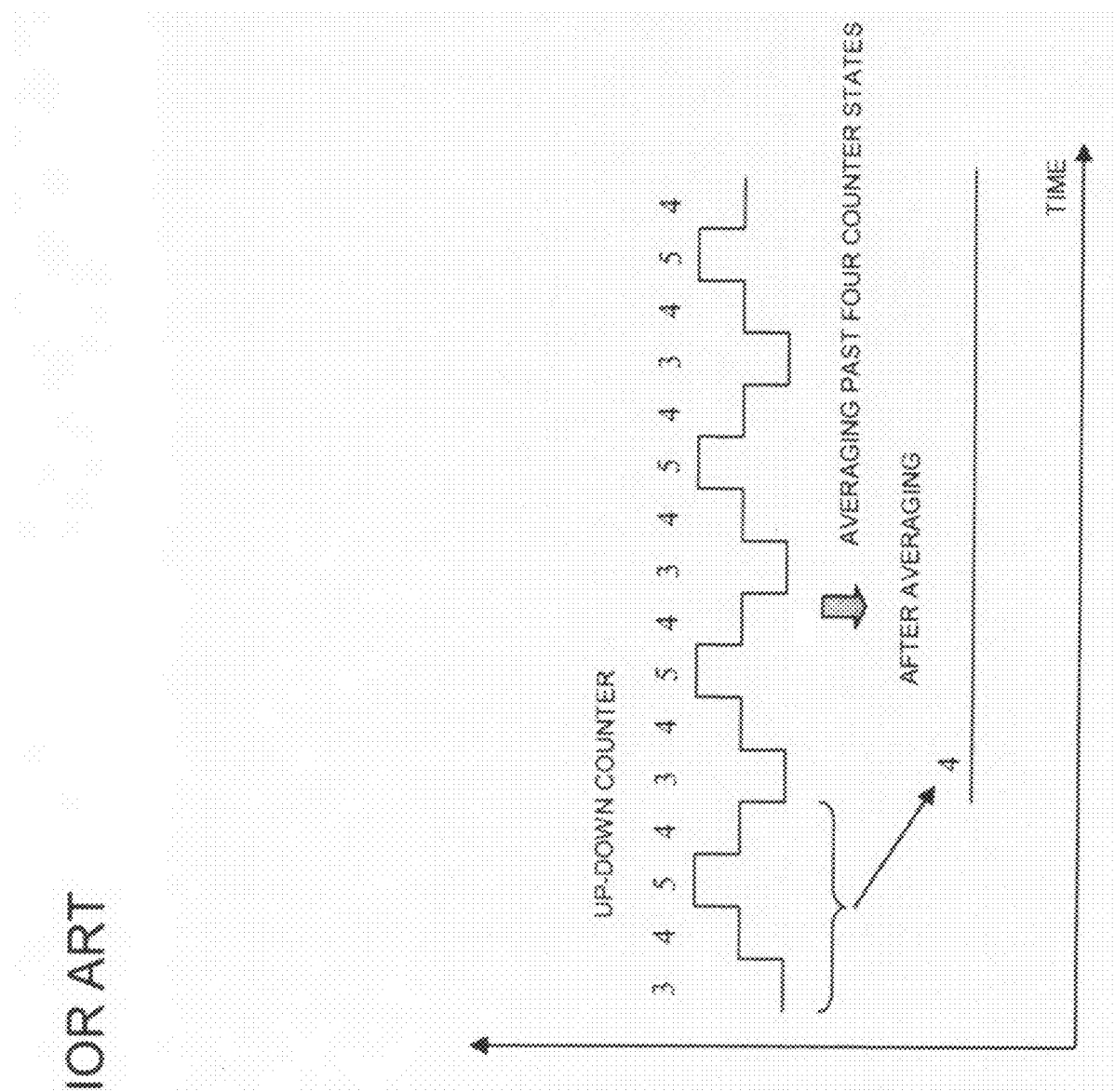
FIG. 32 is a graph showing outputs of the averaging circuit in the up-down counter operation shown in FIG. 31.
Figure 33:
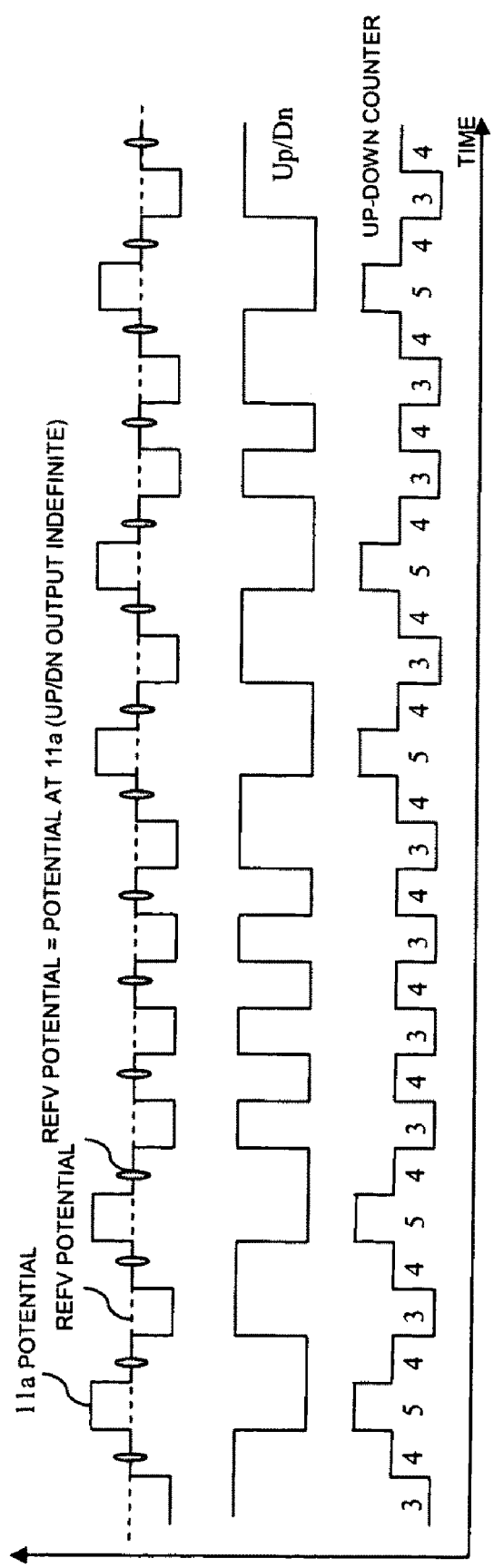
FIG. 33 is a waveform diagram showing a typical up-down counter operation of FIG. 27 in case the potential is converging with repetition of three alternating states.
Figure 34:
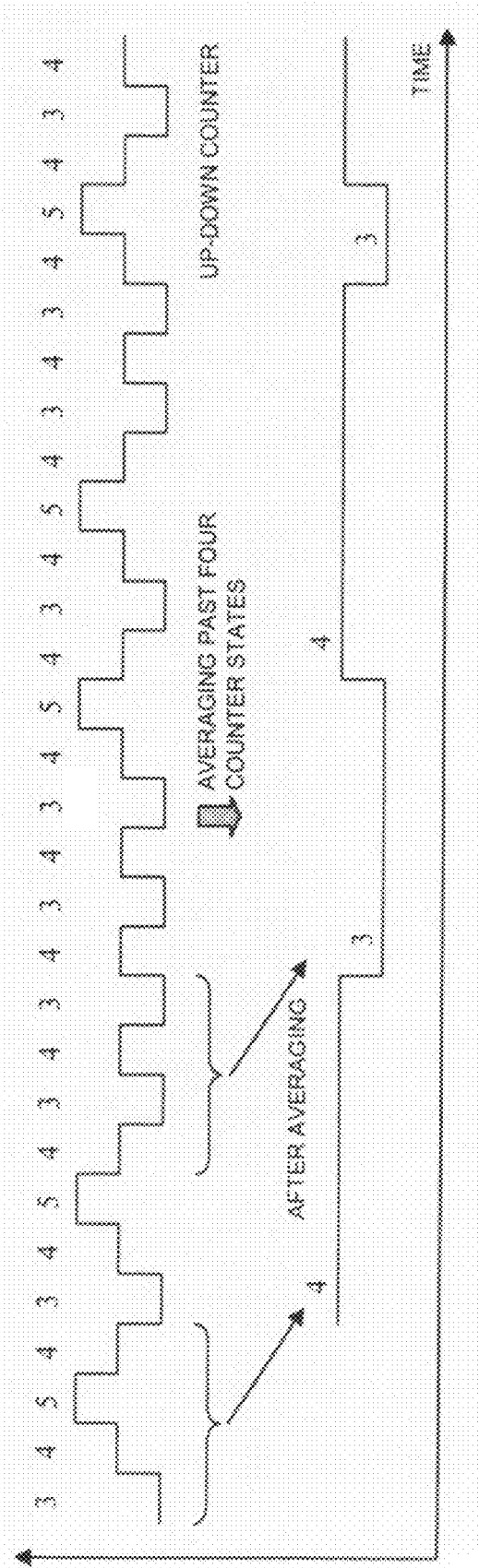
FIG. 34 is a waveform diagram showing outputs of the averaging circuit in the up-down counter operation shown in FIG. 33.

The related technique shown in FIGS. 27 and 28 is an impedance adjustment circuit that takes an average of past N count states, with the number of the synchronization circuits needed being m×(N+2).

Hence, with the present Example, the number of the synchronization circuits is lesser by m×N than that in the case of the related technique shown in FIGS. 27 and 28, thus allowing the circuit size to be reduced.

The operation of the impedance adjustment circuit of the present Example is now described. The monitor circuit 13 compares the difference between the signals X and Y, and determines the state of Z so that $Z=X-1$ if $X-Y\geq 2$, $Z=X+1$ if $X-Y\leq -2$, and $Z=Y$ (hold) if $|X-Y|\leq 1$.

The monitor circuit 13 is able to set the monitor range in general to ±N or to arbitrary values, such as +2 or −1. In the following, an instance of a case in which the difference between X and Y allowed for by the monitor circuit 13 is set to ±1, will be described.

Also, the initial value of X of the replica resistor control counter 11 and that of Y of the resistor-under-adjustment control signal holding circuit 12 are both set to 0, only by way of illustration.

The UPDOWN when the potential n1=potential n2 is indefinite. However, for convenience for description of the operation, it is assumed that the potential n1=potential n2 does not hold.

<Normal Operation>

Figure 5B:
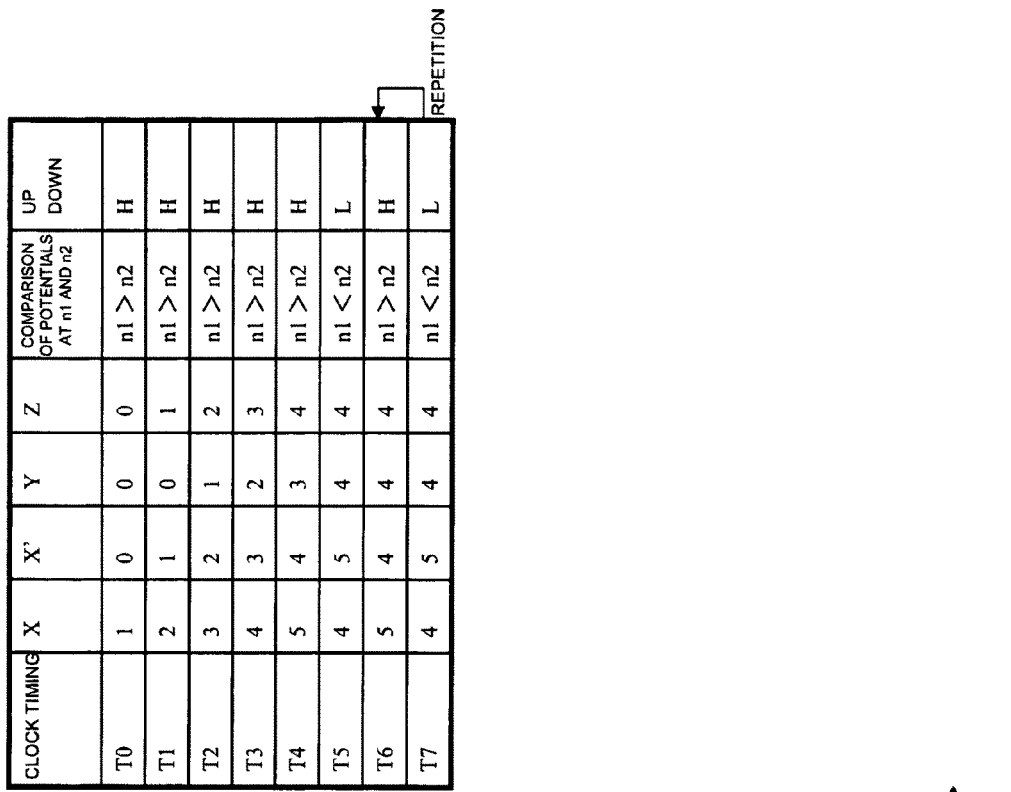
FIG. 5B is a tabulated diagram for illustrating the normal operation of Example 1 of the present invention.
Figure 5A:
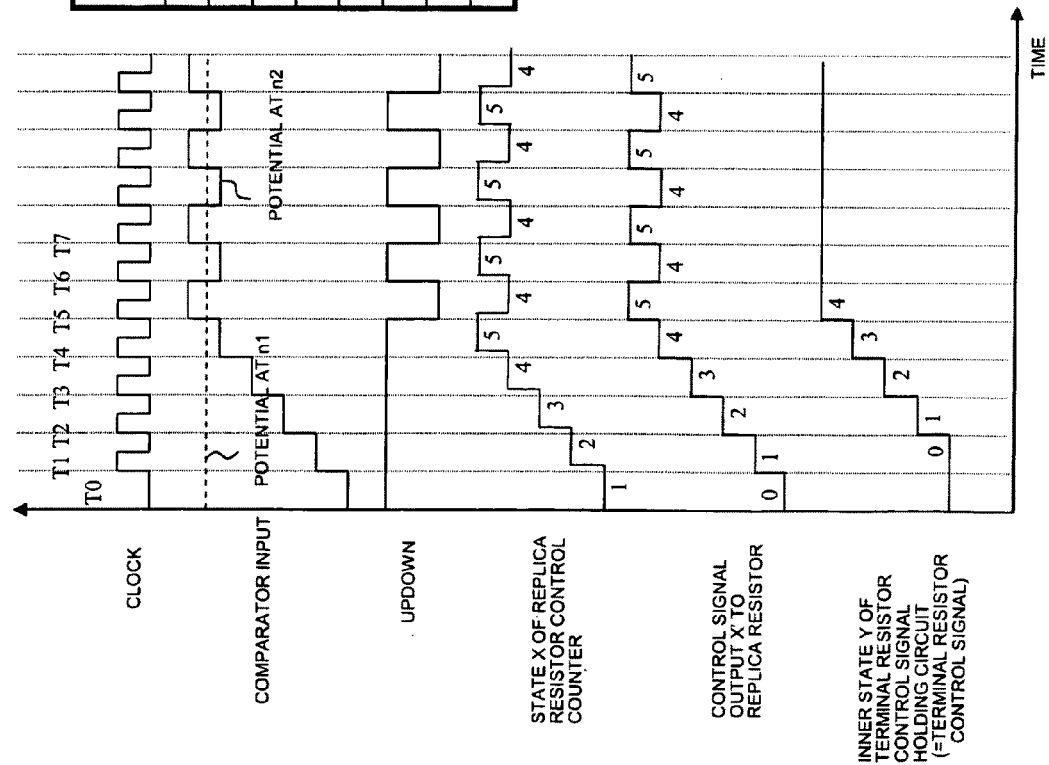
FIG. 5A is a timing chart for illustrating the normal operation of Example 1 of the present invention.

FIG. 5A depicts a timing chart showing that the terminal resistor setting code is not changed in the converging state following resistance adjustment. FIG. 5B depicts the state transitions. Specified operation is as follows:

In the initial state T0, since n1>n2,
UPDOWN="H", such that $$X="1".$$

On the other hand, since Y="0", $$|X-Y|=1 \leq 1$$

such that the output Z of the monitor circuit 13 is Z=Y=0.

At a timing T1, a previous state of X (=1) is substituted into X', and a previous state of Z (=0) is substituted into Y.

Since X' is raised by one step, the resistance value of the replica resistor 4 is also raised by one step, with the potential of n2 also increasing. Since n1>n2, UPDOWN="H", so that $$X=2.$$

On the other hand, since |X−Y|=2≧2, the output Z of the monitor circuit 13 is Z=X−1=1.

At a timing T2, a previous state of X (=2) is substituted into X', and a previous state of Z (=1) is substituted into Y.

Since X' is raised by one step, the resistance value of the replica resistor 4 is also raised by one step, with the potential at n2 also increasing. Since n1>n2 at this time, UPDOWN="H", so that x=3.

On the other hand, since |X−Y|=2≧2, the output Z of the monitor circuit 13 is $$Z=X-1=2.$$

The above process is repeated, such that X, X' and Y are incremented, and hence the resistance values of the replica resistor 4 and the resistor under adjustment 5 and the potential at n2 are increased.

At a timing T5, a previous state of X (=5) is substituted into X', and a previous state of Z (=4) is substituted into Y. Hence, X' and the resistance value are increased by one step and the potential at n2 increases. Since the resistance of the replica resistor 4 now exceeds the reference resistance value, n1<n2, so that UPDOWN="L" and $$X=4.$$

On the other hand, since |X−Y|=0≦1, the output Z of the monitor circuit 13 is Z=Y=4.

At a timing T6, a previous state of X (=4) is substituted into X', and a previous state of Z (=4) is substituted into Y. Hence, X' and the resistance value of the replica resistor 4 are each decreased by one step, so that the potential at n2 decreases.

At X'=4, n1>n2, so that UPDOWN="H" and hence X=5.

On the other hand, since |X−Y|=1≦1, the output Z of the monitor circuit 13 is Z=Y=4, so that the state is not changed from the previous state.

At a timing T7, the state of T5 is reproduced, and hence the states of T5 and T6 is repeated in this order.

At this time, the states of "4" and "5" are repeated for X in this order. However, Y is constant at "4" for all time, and hence the resistor setting code for the resistor under adjustment 5 is unchanged. Hence, stabilization of the resistance value is fulfilled.

<Operation in Case Temperature Rises with Lapse of Time and the Resistance Value Increases>

FIG. 6A depicts a timing chart showing the manner in which, in case the temperature rises with time and the resistance value also rises with lapse of time, the resistance code is changed in keeping with such change in temperature. FIG. 6B depicts a diagram showing corresponding state transitions. The concrete operations at this time follow:

In the initial state T0, X=4, X'=4 and Y=4. The operations from timing T0 until timing T3 are the same as those in the converging state during the normal operations described above. That is, X and X' alternate between 4 and 5 in a repeated fashion, whilst Y is kept constant at "4".

However, at the timing T4, even though X' is lowered by one step from "5" to "4", the potential at n1 remains lower than that at n2 (potential at n1<potential at n2) due to rise in the resistance value with temperature (rise in the resistance value of the replica resistor 4). Hence, UPDOWN="L" is output, such that X is lowered by one step from "4" to "3".

Since |X−Y|=1≦1, the output Z of the monitor circuit 13 is Z=Y=4.

At a timing T5, a previous state of X (=3) is substituted into X', and a previous state of Z (=4) is substituted into Y.

Since n1>n2 for X'=3, UPDOWN="H", such that X=4.

On the other hand, since |X−Y|=0≦1, the output Z of the monitor circuit 13 is Z=Y=4.

At a timing T6, a previous state of X (=3) is substituted into X', and a previous state of Z (=4) is substituted into Y.

Since n1>n2 for X'=3, UPDOWN="H", such that X=4.

On the other hand, since |X−Y|=0≦1, the output Z of the monitor circuit 13 is Z=Y=4.

For timing T7 until timing T8, the states which are the same as those for T5 until T6 are repeated.

For timing T9, a previous state for X (=3) is substituted into X', and a previous state for Z (=4) is substituted into Y.

However, even though X' is lowered by one step from "4" to "3", the potential at n1 keeps on to be lower than that at n2 (n1<n2), such that UPDOWN="L" is output, and hence X is lowered one step from "3" to "2".

On the other hand, since X−Y=−2≦−2, the output Z of the monitor circuit 13 is such that Z=X+1=3.

For timing T10, a previous state for X (=2) is substituted into X', and a previous state for Z (=3) is substituted into Y.

Since n1>n2 for X'=2, UPDOWN="H", such that X=3.

On the other hand, since |X−Y|=0≦1, the output Z of the monitor circuit 13 is such that Z=Y=3.

This sequence of operations is repeated in case the resistance value rises with rise in temperature. That is, even though the resistance value of the LSI is increased with rise in temperature, the resistance code is automatically lowered, that is, changed to a lower resistance setting, in keeping with increase in the resistance value, such as to allow the resistance value to converge automatically to a new optimum value.

In similar manner, when the resistance value of the LSI is decreased with lowering in temperature, the resistance code is automatically raised, that is, changed to a higher resistance setting, in keeping with decrease in the resistance value, such as to allow the resistance value to converge automatically to a new optimum value.

<Automatic Restoration in Case of Transition to Abnormality>

FIG. 7A depicts a timing chart for the self-restoration operation in case the inner state of the resistor-under-adjustment control signal holding circuit 12 has changed to abnormal values under the effect e.g. of extraneous noise. FIG. 7B depicts a diagram showing the state transitions.

In the initial state T0, X=4, X'=4 and Y=4.

For timings T0 until T3, the converging state is similar to that during the normal operation. That is, X and X' alternate between "4" and "5" in this order, in a repeated manner, whilst Y is at a constant value "4".

Suppose that Y has changed from "4" to "9" (abnormal value) by a mistaken operation due to extraneous noise. Since X and X' operate as normally, a previous state of X (=5) is substituted into X'.

Since n1<n2 for X'=5, UPDOWN="L", such that X=4.

Moreover, since X−Y=−5≦−2, an output Z of the monitor circuit 13 is such that Z=X+1=5.

At the next timing T5, a previous state of X (=4) is substituted into X', while a previous state of Z (=5) is substituted into Y.

Since n1>n2 for X'=4, UPDOWN="H", such that X=5.

Since |X−Y|=0≦1, an output Z of the monitor circuit 13 is such that Z=Y=5.

At the next timing T6, a previous state of X (=5) is substituted into X', whilst a previous state of Z (=5) is substituted into Y.

Since n1<n2 for X'=5, UPDOWN="L", such that X=4.

On the other hand, since |X−Y|=1≦1, the output Z of the monitor circuit 13 is such that Z=Y=5.

The state at timing T7 is the same as that at timing T5. Hence, the operation for T5 until T6 is repeated in this order as from T7.

Thus, even though Y has shifted to an abnormal state, the counter state is stabilized at a constant value within X±1.

This self-restoration operation is made possible by a configuration in which the monitor circuit 13 checks the state of the resistor-under-adjustment control signal holding circuit 12 for all time.

The above-described Example 1 is for a case where Y has shifted to an abnormal value larger than X. The operation is similar even in case Y has shifted to an abnormal value lesser than X. In such case, Y is ultimately stable at 4 (Y=4).

EXAMPLE 2

An Example 2 of the present invention will now be described. In the above-described Example 1, the monitor circuit 13 sets X=7 (maximum value), X'=7 (maximum value) and Y=6. If, in this case, UPDOWN="H" is input, the selector 113 selects X' (=7) and outputs it as X. Hence, X remains at 7 without being changed.

Since |X−Y|=1≦1, Z=Y=6, so that, at the next timing, Y is kept to be 6 (Y=6), without being changed to 7. Similarly, Y=0 also does not hold, except the case of resetting or setting.

That is, the settable resistance code range is not exploited effectively, that is, not exploited from end to end. This deficiency is eliminated with the present Example by using the configuration of the resistor control circuit shown in FIG. 8.

Figure 8:
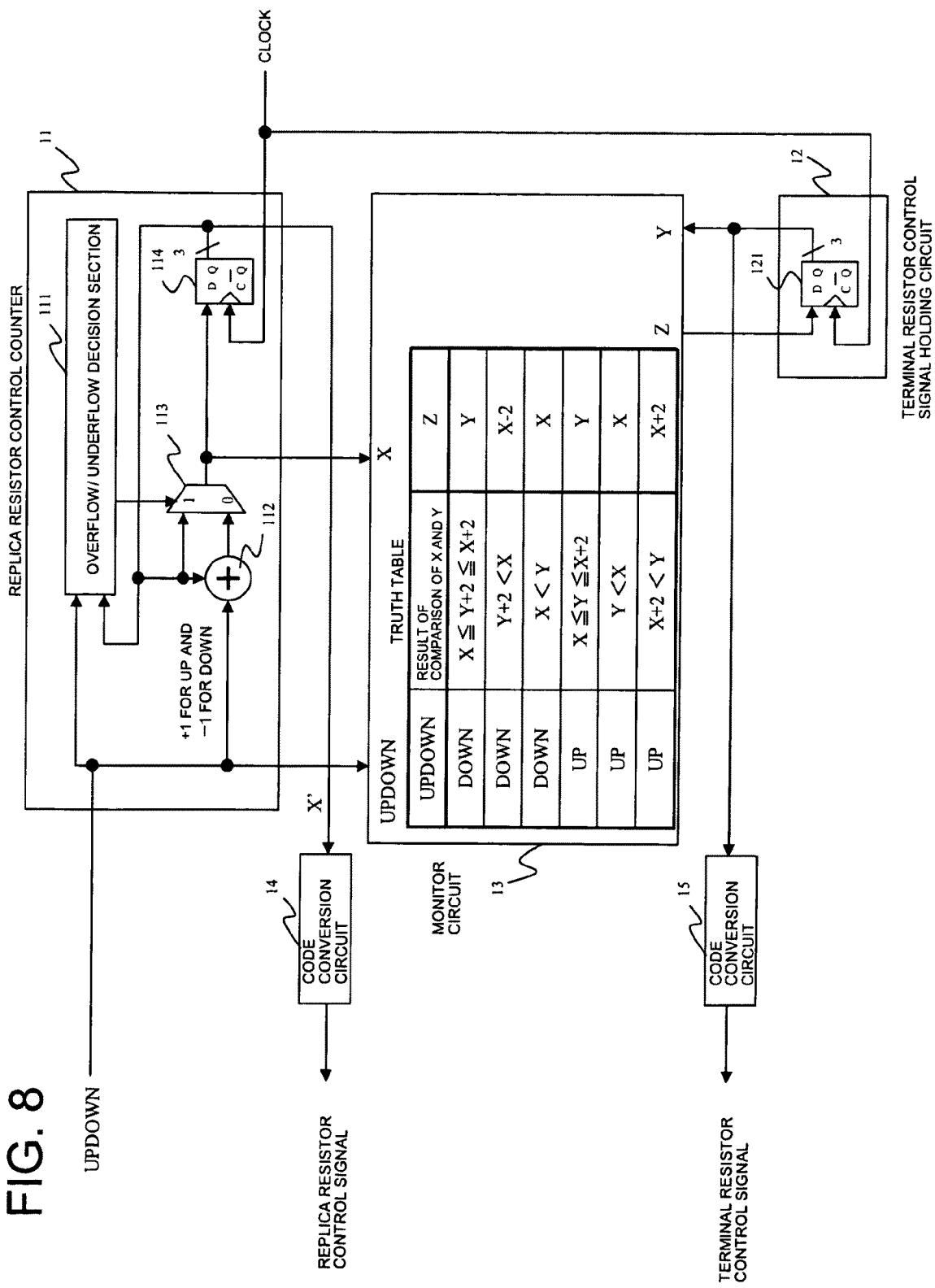
FIG. 8 is a circuit diagram showing a configuration of a resistor control circuit of an Example 2 of the present invention.

In FIG. 8, control of the monitor circuit 13 differs from that shown in FIG. 3.

For example, in the monitor circuit 13, if, with X=7 and Y=6, UPDOWN="H" is input, X is kept to be 7. Since Y<X in the truth table showing the operation of the monitor circuit 13, Z=X=7. Hence, Y=7 at the next clock timing.

Similarly, if X=0 and Y=1, X<Y, so that Y=0 at the next clock timing. That is, the settable resistance code range (the range from end to end) may be exploited effectively.

EXAMPLE 3

Figure 9:
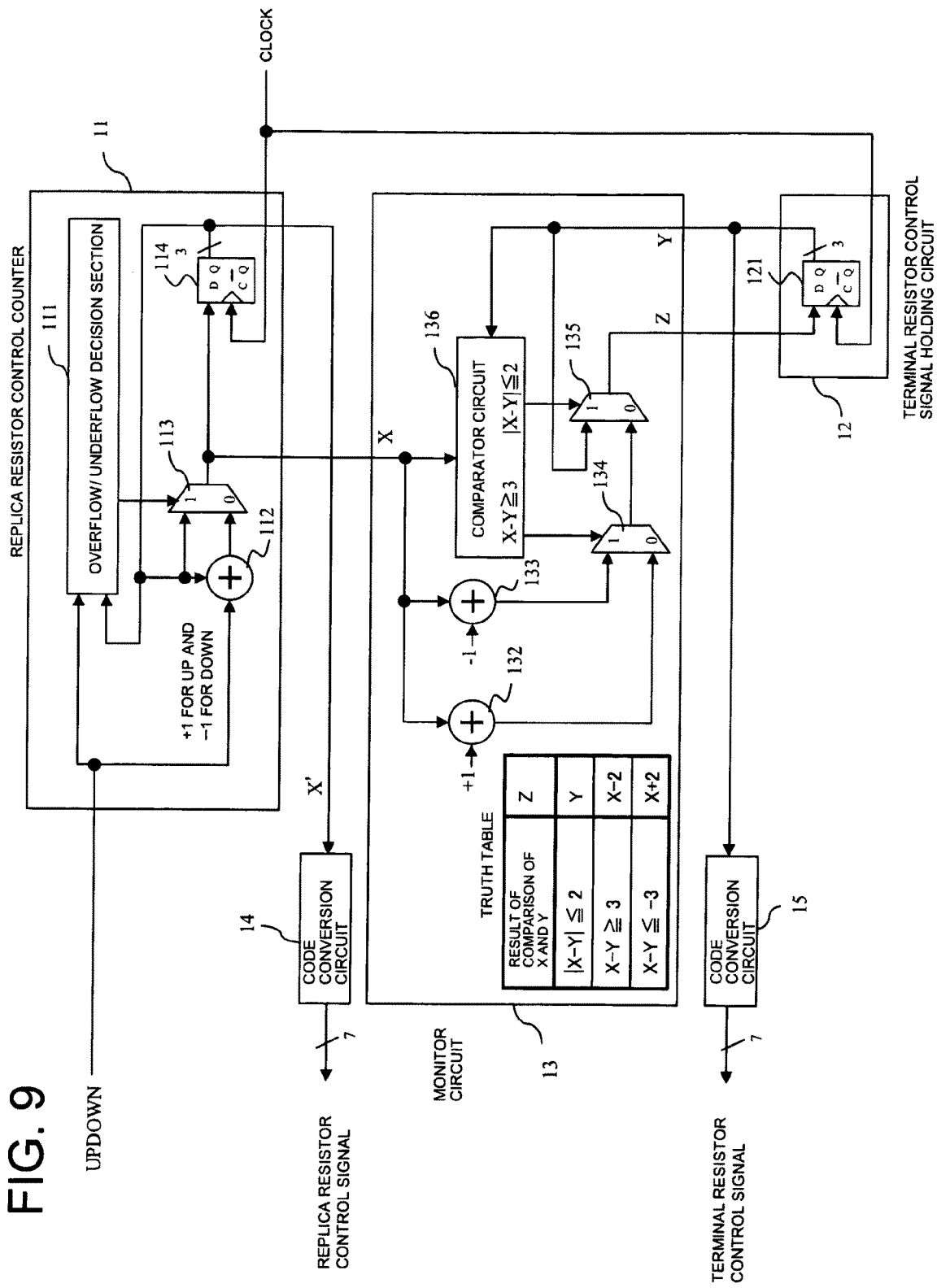
FIG. 9 is a circuit diagram showing a configuration of a resistor control circuit of an Example 3 of the present invention in which the range tolerated by a monitor circuit of Example 3 of the present invention is set to ±2.

In the above Examples 1 and 2, control is exercised so that Y is within the range of Y=X±1. However, if the output of the replica resistor control counter 11 is subjected to drifting due to noise or to certain comparator performance, the monitor range by the monitor circuit 13 may be changed so that the difference between X and Y will be within the range of ±2. A configuration of the Example 3 of the present invention, designed to cope with this problem, is shown in FIG. 9. In this Example, the operation of the monitor circuit 13 (truth table) has been changed as shown in FIG. 9.

Specifically, the setting is made as follows:

$Z=Y$ if $|X-Y|\leq 2$ $Z=X-2$ if $X-Y\geq 3$ and $Z=X+2$ if $X-Y\leq -3$

Figure 10:
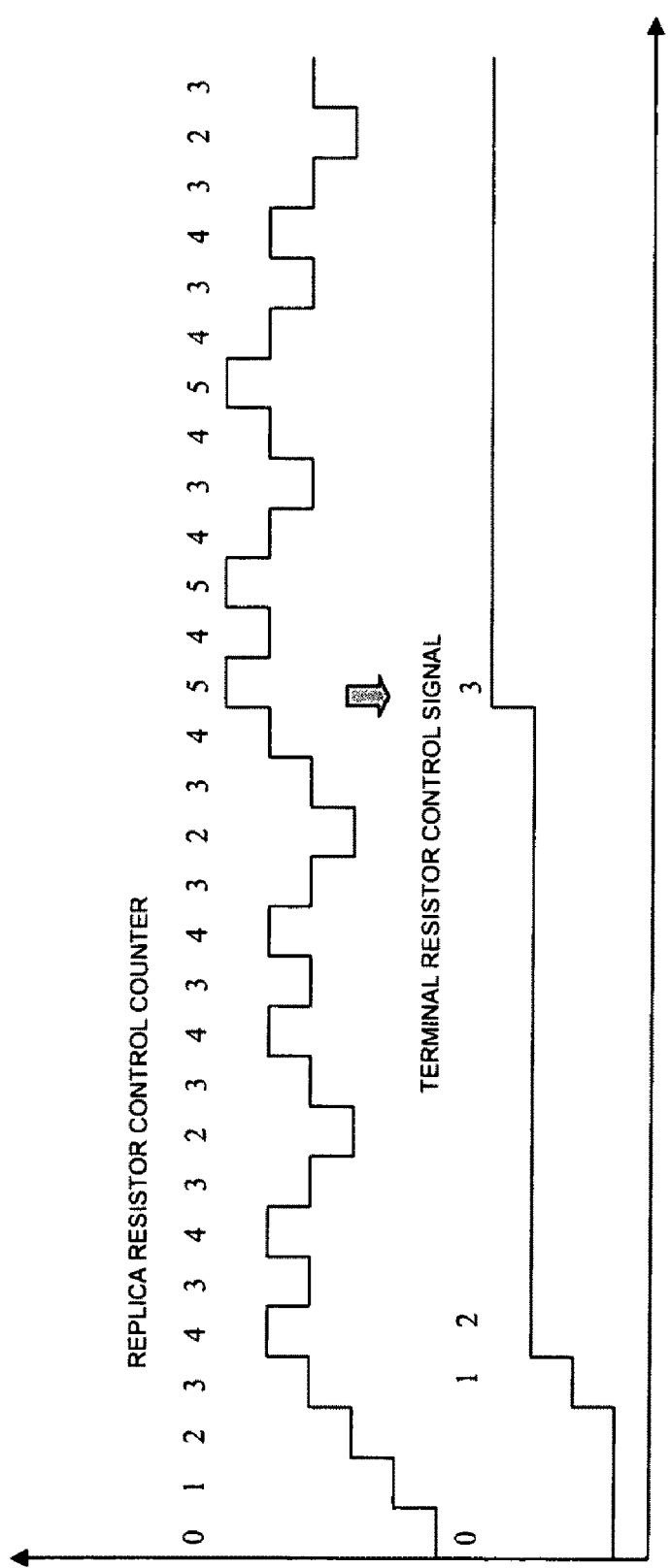
FIG. 10 is a timing chart for illustrating counter states and signals in case the range tolerated by a monitor circuit of Example 3 of the present invention is set to ±2.

FIG. 10 depicts a timing chart for illustrating an example operation of the present Example 3. Specifically, FIG. 10 shows typical time transitions of the state of the replica resistor control counter 11 (state X) and the terminal resistor control signal Y. With the use of this timing chart, it is possible in general to set the range of the monitor circuit so that $|X-Y|\leq N$. It is also possible to provide for different ranges for the positive and negative sides, for example, a range for the minus side of 2 ($|X-Y|\leq 2$) and a range for the plus side of 1 ($|X-Y|\leq -1$).

EXAMPLE 4

Figure 11:
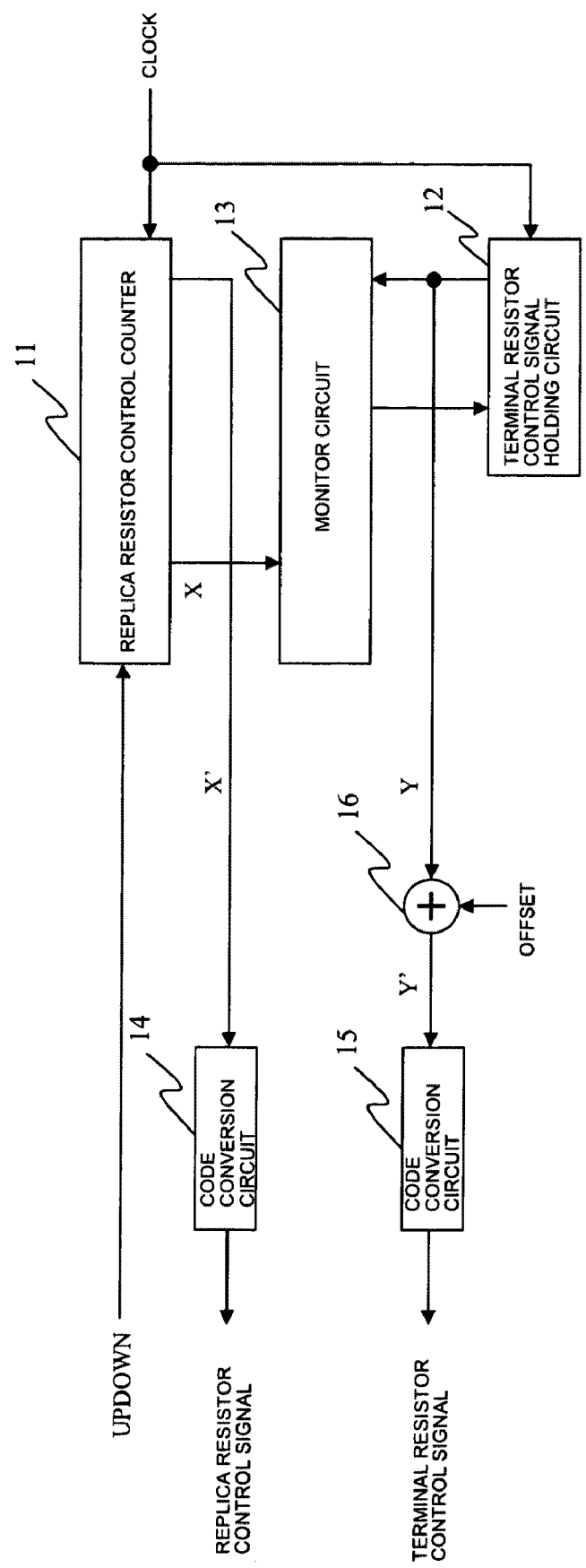
FIG. 11 is a circuit diagram showing a first instance of construction of a circuit in which an offset is given on the resistor setting code in an Example 4 of the present invention.

FIG. 11 depicts a configuration of an Example 4 of the present invention. In the configuration of the present Example, offset is given on the terminal resistor control signal side. For example, in case of a large layout wiring resistance from the resistor under adjustment to the terminal pad, the resistance value of the resistor under adjustment as observed from the terminal pad is greater than a desired resistance value if the resistance code that adjusts the resistor under adjustment is the same level as the setting code for the replica resistor.

So, an optional offset is added to an output Y of the resistor-under-adjustment control signal holding circuit 12 by the adder 16, and the so offset output is delivered as input to the code conversion circuit 15, as shown in FIG. 11.

For example, if the offset is −1, Y'=Y−1 is delivered to the code conversion circuit 15. By so doing, the terminal resistor value in the converging state may be set to be one step lower, thus enabling the difference from the wiring resistance to be canceled.

EXAMPLE 5

Figure 12:
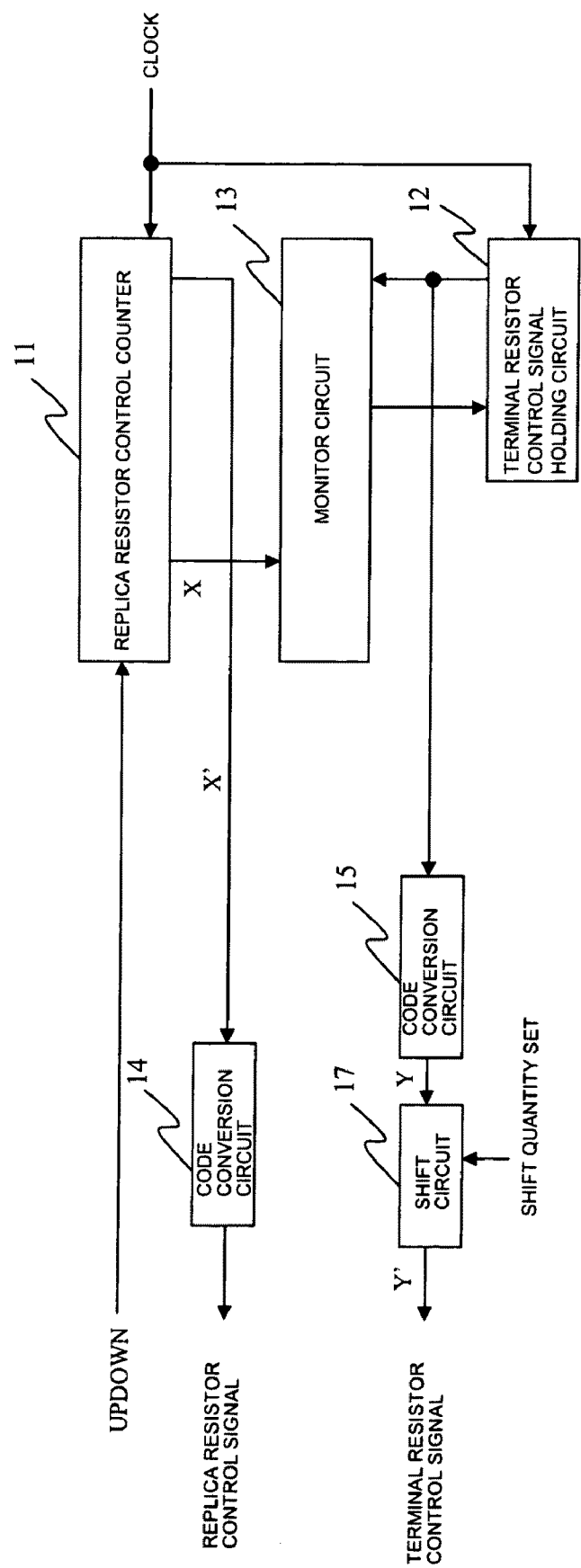
FIG. 12 is a circuit diagram showing a second instance of construction of a circuit in which an offset is given on the resistor setting code in an Example 5 of the present invention.

FIG. 12 shows a configuration of an Example 5 of the present invention. The present Example shows a configuration of giving an offset to the terminal resistor control signal side. A shift circuit 17 shifts an output code Y of the code conversion circuit 15 to output the so shifted output Y'.

The present Example differs from the previous Example 4 shown in FIG. 11 as to the location where the offset is given. The beneficent result obtained is the same as that of the previous Example 4.

If, in FIG. 12, the thermometer code, an output code of the code conversion circuit 15, is shifted one bit towards right, for example, from "0000111" to "0000011", the resistance value is lowered. If the thermometer code is shifted towards left, the resistance value is raised.

EXAMPLE 6

Figure 13:
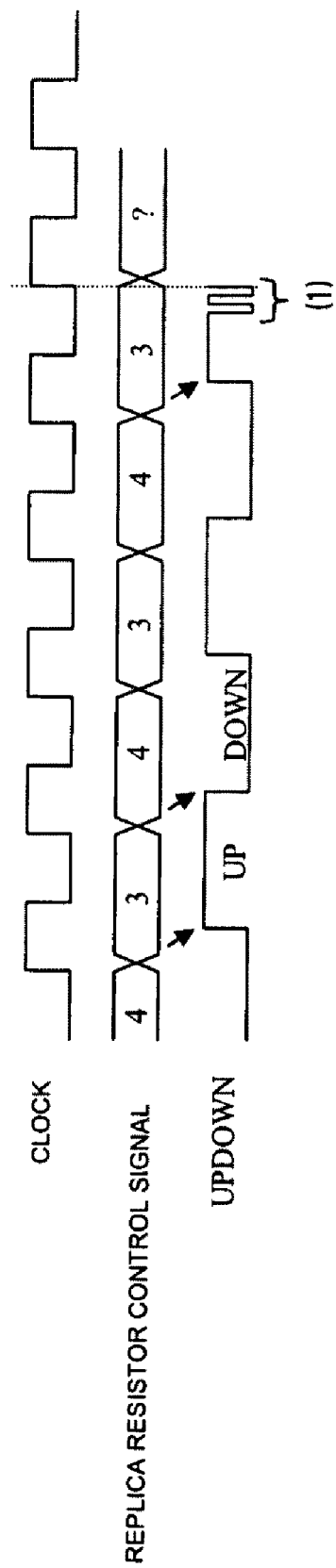
FIG. 13 is a timing chart for illustrating signals in case the UPDOWN signal is instable in Example 5 of the present invention.

In case of a large power supply noise or in case of the comparator input potentials for comparison being equal to each other, there is a possibility that the UPDOWN signal is not stabilized, thus giving rise to chattering, as shown in FIG. 13(1). If, at the clock rise timing, the UPDOWN is not stable, as shown in FIG. 13(1), a setup/hold error is likely to be produced in the flip-flops 114 within the replica resistor control counter 11. The setup/hold error is produced when the setup time condition or the hold time condition is not met. Should this error occur, data may not be sampled reliably. Moreover, it may not be known which is the next counter state. Such condition may occur in case of the delay in the operation of the comparator 2 being large as well (see FIG. 1).

Figure 14:
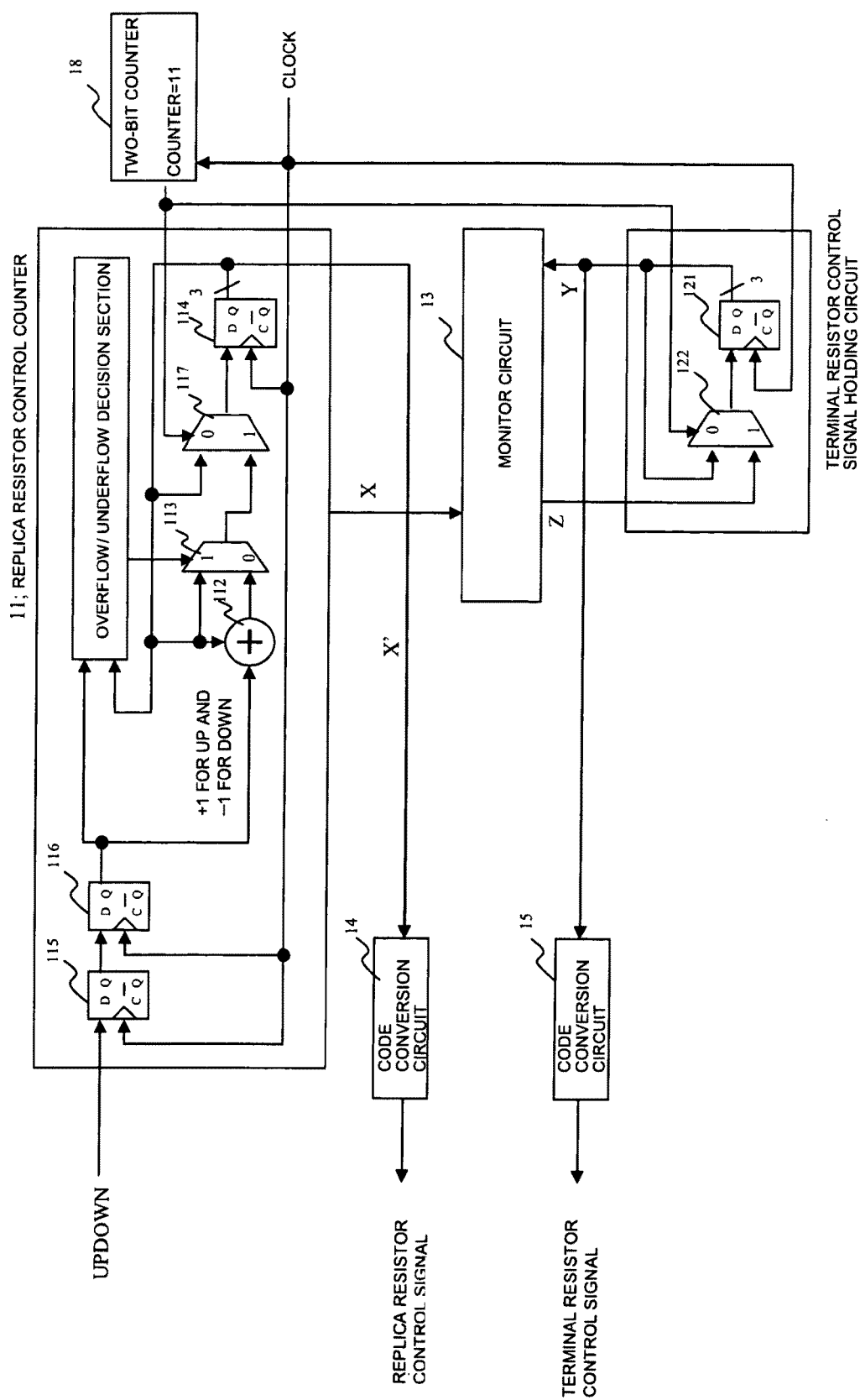
FIG. 14 is a circuit diagram showing a resistor control circuit in which an UPDOWN signal is synchronized with respect to a clock in an Example 6 of the present invention.

An Example 6 of the present invention is adapted to cope with this problem. FIG. 14 shows the configuration of the Example 6 of the present invention designed to eliminate the inconvenience. The UPDOWN signal is synchronized with two flip-flops 115, 116. These flip-flops operate for retiming the UPDOWN signal. In this case, a latency equivalent to about two clock cycles is added to the UPDOWN signal, so that the counter 11 needs to be updated once per three or more clocks.

In case wherein the counter should be updated once for three or more clocks, it is sufficient to connect a two-bit counter 18 to the resistor control circuit as shown in FIG. 14 and to update the counter 14 once per four clocks. The two-bit counter 18 is driven by a clock. An output of The two-bit counter 18 is supplied as a selection control signal to a selector 117 that selects an output of the flip-flop 114 and an output of the selector 113. When the output of the two-bit counter 18 is 1, the selector 117 selects an output of the selector 113 to deliver it to a data input terminal of the flip-flop 114. When the output of the two-bit counter 18 is 0, the selector 117 selects an output of the flip-flop 114 to deliver it to the data input terminal of the flip-flop 114. The output of the two-bit counter 18 is delivered as a selection control signal to a selector 122 that selects an output Y of the flip-flop 121 or Z. When the output of the two-bit counter 18 is 1, the selector 122 selects Z to output it to an data input terminal of the flip-flop 121. When the output of the two-bit counter 18 is 0, the selector 122 selects the output Y of the flip-flop 121 to deliver it to the data input terminal of the flip-flop 121.

Figure 15:
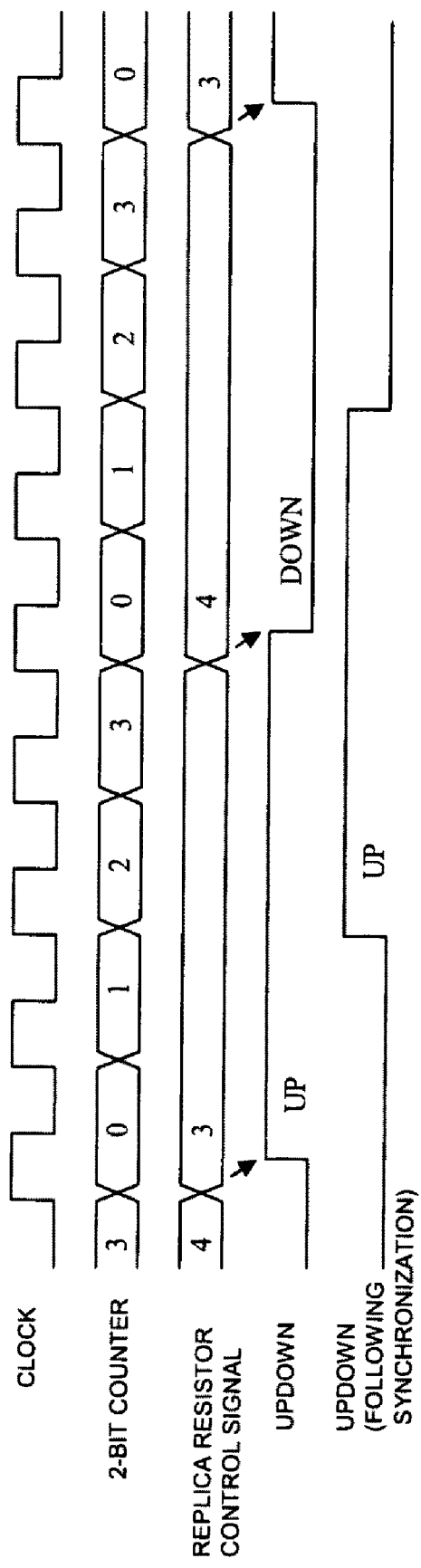
FIG. 15 is a timing chart for illustrating Example 6 of the present invention.

FIG. 15 depicts a timing chart showing a typical operation of the present Example. In FIG. 15, there are shown signal waveforms of a clock, the signal of the two-bit counter 18, a replica resistor control signal, UPDOWN and UPDOWN following the synchronization by the flip-flops 115 and 116.

The UPDOWN signal following the synchronization (an output signal of the flip-flop 116) is delayed by about two clocks, so that it is possible to update the counter 11 every four clocks.

EXAMPLE 7

Figure 16:
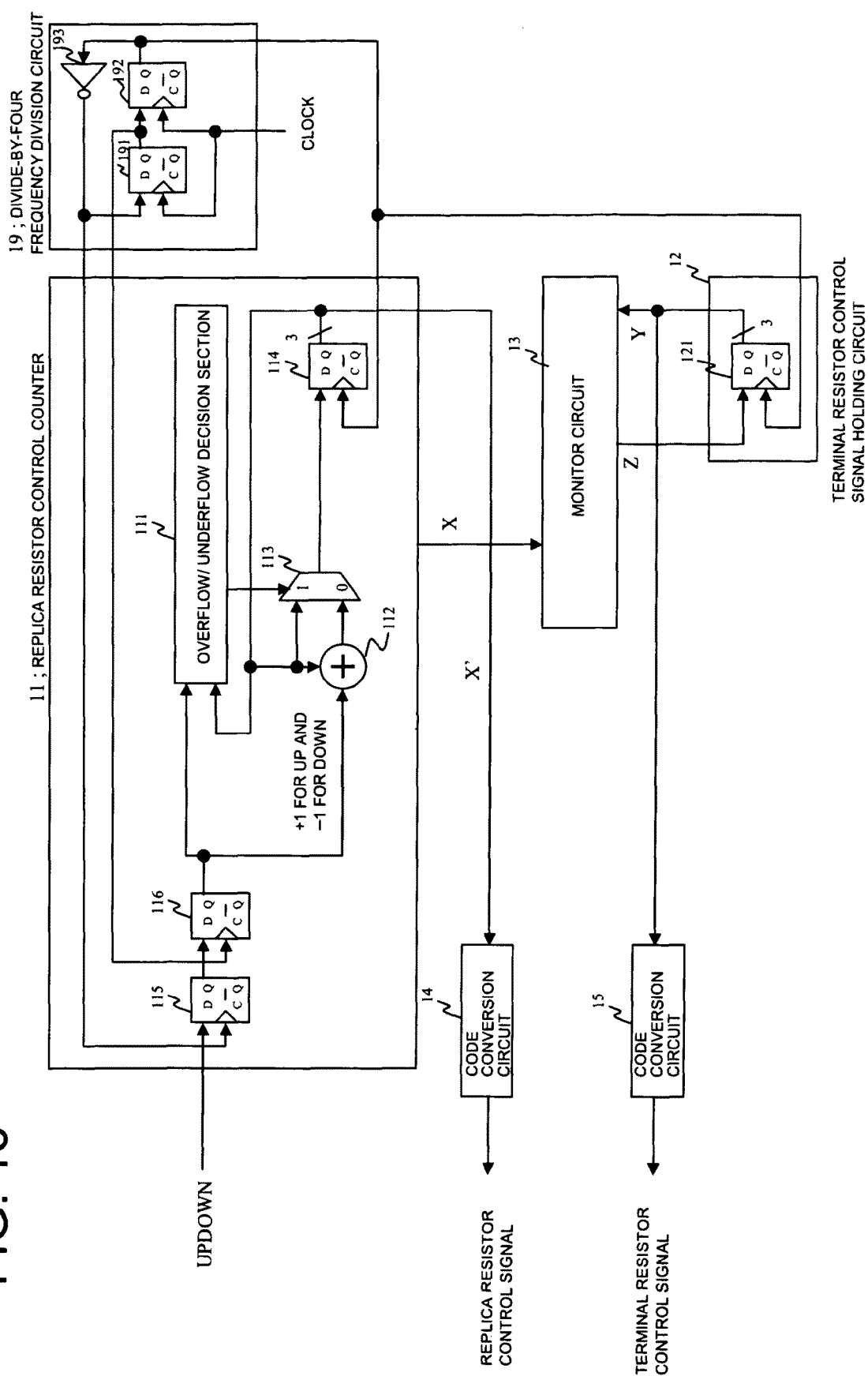
FIG. 16 is a circuit diagram showing another resistor control circuit in which an UPDOWN signal is synchronized with respect to a clock in an Example 7 of the present invention.

FIG. 16 shows a configuration of an Example 7 of the present invention. Referring to FIG. 16, the present Example includes a divide-by-four frequency division circuit 19 supplied with a clock signal, in place of the two-bit counter 18 of the previous Example 6 shown in FIG. 15. With the present Example, multi-phase clocks produced by the divide-by-four frequency division circuit 19 are utilized to synchronize the UPDOWN signal. The divide-by-four frequency division circuit 19 includes flip-flops 191 and 192 and an inverter 193 that inverts an output (Q) of the flip-flop 192 to supply the resulting signal to a data input terminal (D) of the flip-flop 191. An output of the inverter 193 is supplied to a clock terminal (C) of the flip-flop 115, whilst an output of the flip-flop 191 is supplied to a clock terminal of the flip-flop 116.

Figure 17:
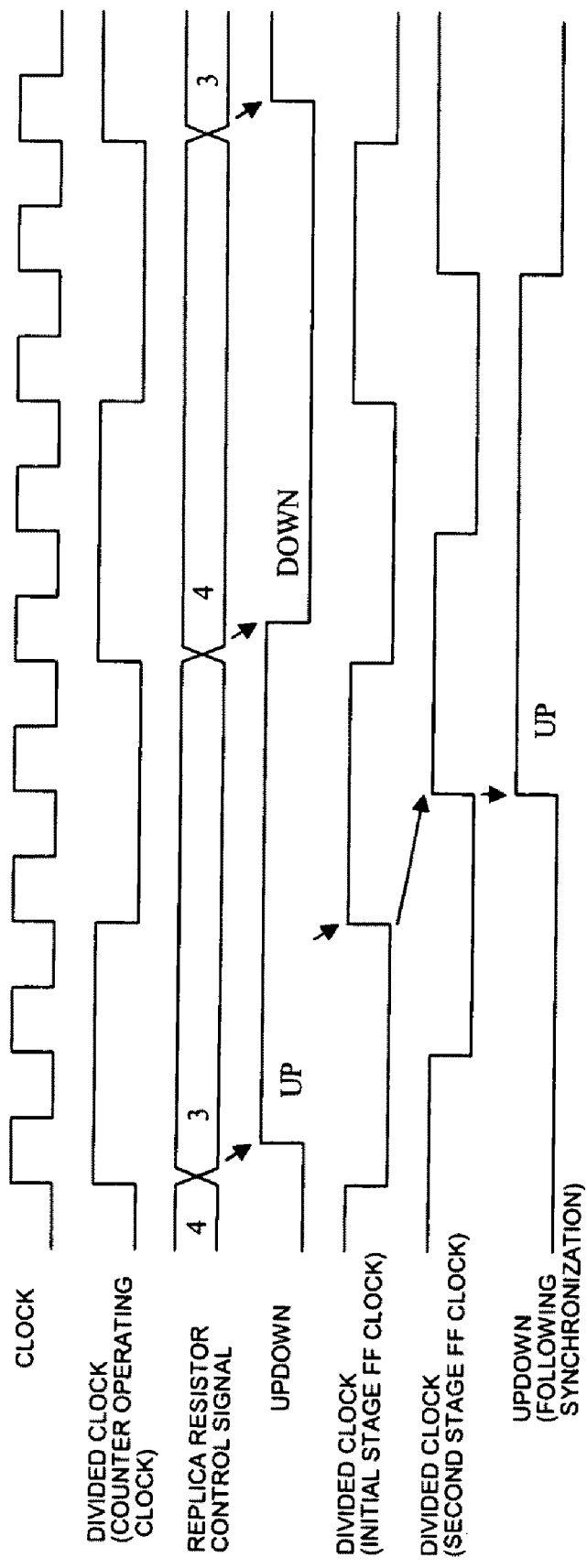
FIG. 17 is a timing chart for an Example 7 of the present invention.

FIG. 17 depicts a timing chart showing the operation of the present Example. Since the UPDOWN signal following the synchronization is delayed by about three clocks, it is possible to update the counter every four clocks. The frequency divided clock (counter operating clock) is an output of the flip-flop 192 of FIG. 16. An output of the inverter 193 (an inverted signal of the output of the flip-flop 192, that is, a counter operating clock) is supplied to a clock terminal of the initial-stage flip-flop 115. An output of the flip-flop 191 is supplied to a clock terminal of the second-stage flip-flop 116, and has a rising edge delayed by one clock from the frequency divided clock supplied to the initial-stage flip-flop 115.

EXAMPLE 8

Figure 18:
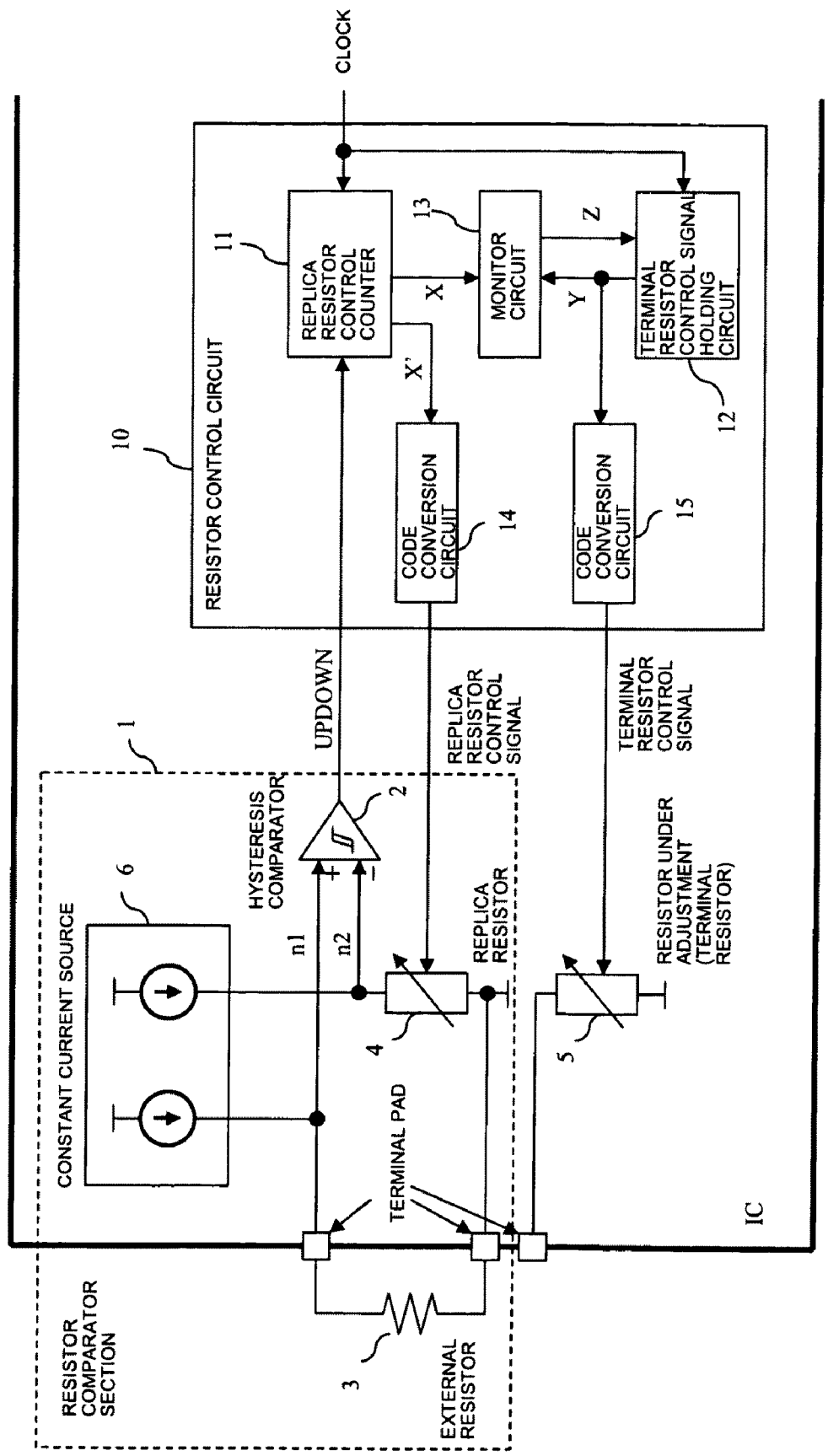
FIG. 18 is a circuit diagram showing an impedance adjustment circuit that uses a hysteresis comparator in an Example 8 of the present invention.

FIG. 18 depicts a configuration of an Example 8 of the present invention. In the present Example, the comparator 2 has a hysteresis characteristic. Thus, it is possible to suppress the noise or the UPDOWN instabilities in case the voltages to be compared to each other (n1, n2) are at the same potential. Otherwise, the present Example is similar in configuration to the Example shown in FIG. 3 and hence the detailed description is dispensed with.

EXAMPLE 9

Figure 19:
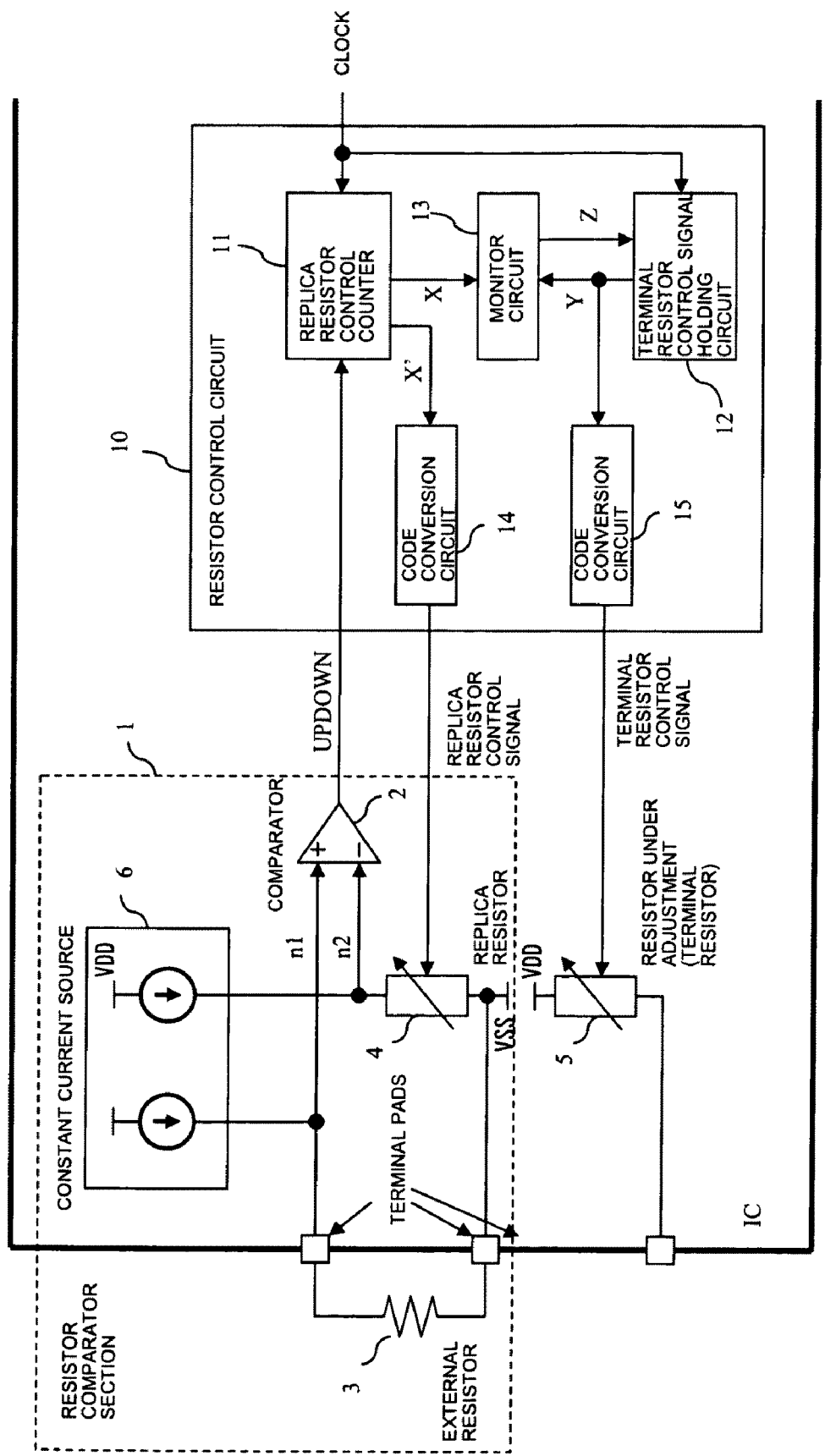
FIG. 19 is a circuit diagram showing a configuration of an Example 9 of the present invention.

FIG. 19 depicts a configuration of an Example 9 of the present invention. With the present Example, it is possible to connect the replica resistor 4 to the VSS and to connect the resistor under adjustment 5 to the VDD side. In FIG. 19, the power supply, the replica resistor 4 is connected to, and the power supply, the resistor under adjustment (terminal resistor) 5 is connected to, are interchanged with respect to the arrangement shown in FIG. 1.

EXAMPLE 10

Figure 20:
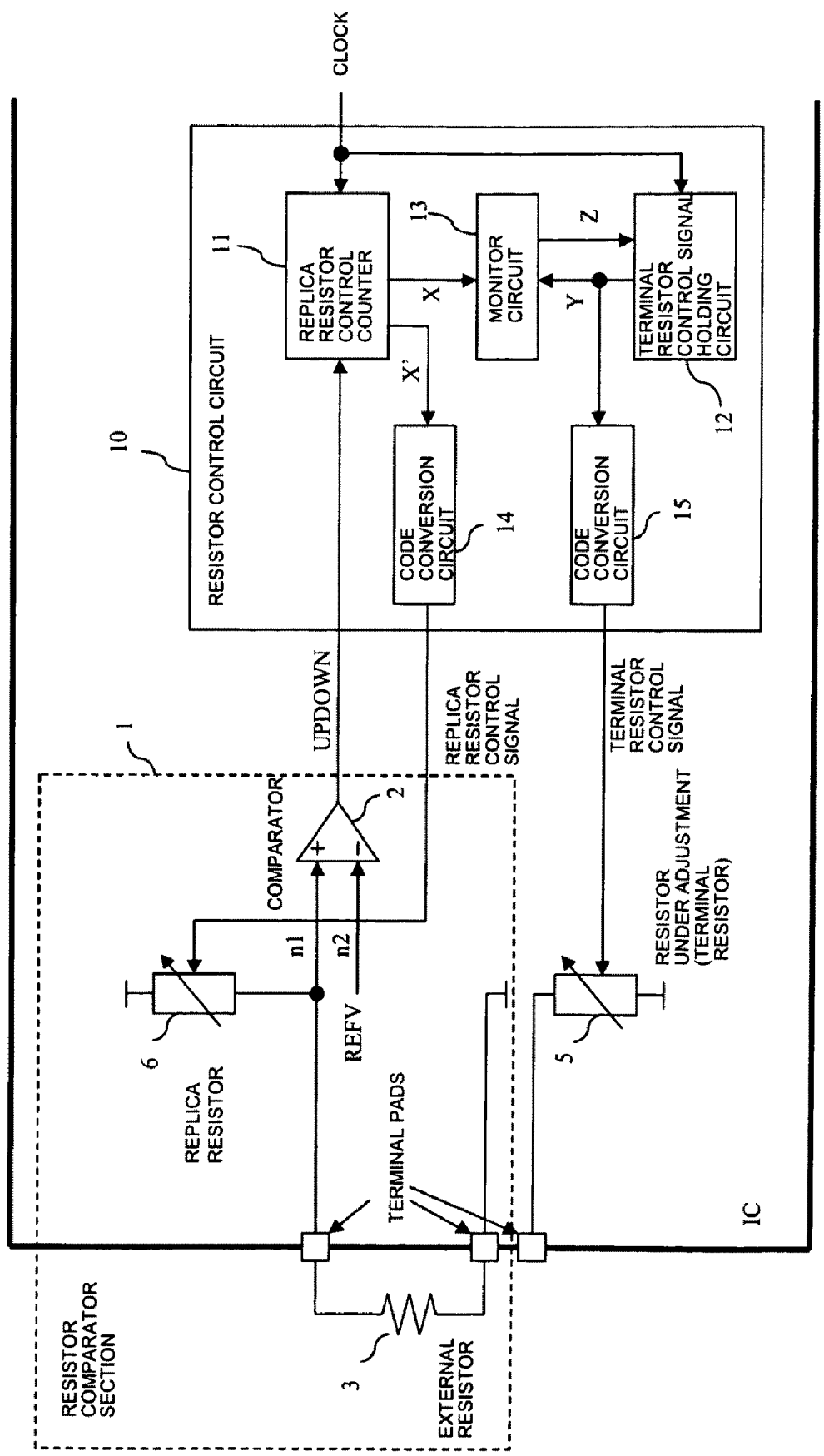
FIG. 20 is a circuit diagram showing an instance of a configuration of a resistor comparator section used in an Example 10 of the present invention.

FIG. 20 shows a configuration of an Example 10 of the present invention. Referring to FIG. 20, it is possible that the resistor comparator section 1 is constructed and designed in the same way as in the related technique (FIG. 27) and to compare the voltage at n1, obtained on voltage division by the replica resistor 4 and the external resistor 3, with the constant reference voltage (REFV).

The operation and the meritorious effect of the above described Examples will now be described.

The present Examples may be constructed and designed with the use of a circuit of a size smaller than if an averaging circuit of the related technique explained with reference to FIGS. 27 and 28 is used.

If the state change of the replica resistor control counter is within a preset range, it is possible to have the setting code for the resistor under adjustment not changed.

The preset range may be prescribed by the monitor circuit and may be expanded to ±N or changed to an optional range such as +2 or −1.

If the resistance value is changed such as with the change of temperature, it may automatically converge to a new optimum value.

If the state of the resistor-under-adjustment control signal holding circuit assumes an abnormal value due to e.g. the noise, it may be self-restored to the normal state.

If each of the terminal resistor and the replica resistor has a fixed error, such as an error by wiring distance, an offset may be provided to the code conversion circuits.

The disclosure of the aforementioned Patent Document 1 is incorporated by reference herein. The particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or corrections that may occur to those skilled in the art in accordance with the within the gamut of the entire disclosure of the present invention, inclusive of claim and the technical concept of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An impedance adjustment circuit for adjusting a resistance value of a resistor under adjustment, the circuit comprising:

a comparator that compares a resistance value of a first resistor and a resistance value of a replica resistor that forms a replica of the resistor under adjustment;

a replica resistor control counter that counts up or down based on a result of comparison by the comparator to produce a control signal that variably controls the resistance value of the replica resistor;

a resistor-under-adjustment control signal holding circuit that holds a control signal that variably controls the resistance value of the resistor under adjustment; and a monitor circuit that receives a state of the replica resistor control counter and an output of the resistor-under-adjustment control signal holding circuit and that delivers an output of the resistor-under-adjustment control signal holding circuit to the resistor-under-adjustment control signal holding circuit, in case the difference between the state of the replica resistor control counter and the output of the resistor-under-adjustment control signal holding circuit is within a preset range.

2. The impedance adjustment circuit according to claim 1, wherein, in case the difference between the state of the replica resistor control counter and the output of the resistor-under-adjustment control signal holding circuit is outside the preset range, the monitor circuit delivers to the resistor-under-adjustment control signal holding circuit a value corresponding to the state of the replica resistor control counter plus or minus a preset value depending on the difference between the state of the replica resistor control counter and the output of the resistor-under-adjustment control signal holding circuit.

3. The impedance adjustment circuit according to claim 1, wherein the monitor circuit includes:

a subtracter that subtracts 1 from the state of the replica resistor control counter to output the subtraction result in case the difference between the state of the replica resistor control counter and the output of the resistor-under-adjustment control signal holding circuit is not less than a preset first value;

an adder that adds 1 to the state of the replica resistor control counter to output the addition result in case the difference between the state of the replica resistor control counter and the output of the resistor-under-adjustment control signal holding circuit is less than a preset second value;

a first selector that receives an output of the subtracter and an output of the adder and that selects, in case the difference between the state of the replica resistor control counter and the output of the resistor-under-adjustment control signal holding circuit is not less than the first value, selects the output of the subtracter; the first selector selecting and outputting the output of the adder in case the difference is less than the first value; and a second selector that receives an output of the first selector and the output of the resistor-under-adjustment control signal holding circuit; the second selector selecting and outputting the output of the resistor-under-adjustment control signal holding circuit in case the difference between the state of the replica resistor control counter and the output of the resistor-under-adjustment control signal holding circuit is within the preset range; the second selector selecting an output of the first selector and outputting the output selected to the resistor-under-adjustment control signal holding circuit in case the difference is outside the preset range.

4. The impedance adjustment circuit according to claim 1, wherein the replica resistor control counter includes:

a decision section that checks the presence of overflow and the presence of underflow;

an adder;

a selector; and a holding circuit;

the adder adding −1 to the result of comparison by the comparator if the result of comparison is of a first value, the adder adding +1 to the result of comparison by the comparator if the result of comparison is of a second value, the selector receiving an output of the adder, an output of the resistor-under-adjustment control signal holding circuit and the result of decision by the decision section, the selector selecting an output of the resistor-under-adjustment control signal holding circuit if the result of addition by the adder indicates an overflow or an underflow, the selector selecting an output of the adder if otherwise, the resistor-under-adjustment control signal holding circuit receiving and holding an output of the selector.

5. The impedance adjustment circuit according to claim 1, further comprising:

a current source that causes currents to flow through the first resistor and the replica resistor, the comparator comparing the terminal voltage of the first resistor to the terminal voltage of the replica resistor.

6. The impedance adjustment circuit according to claim 1, wherein the first resistor is provided as an external resistor connected externally to a semiconductor device.

7. The impedance adjustment circuit according to claim 1, wherein the monitor circuit provides an input to the resistor-under-adjustment control signal holding circuit, based on a predetermined expression regarding the result of comparison by the comparator, the large/small relationship between the state of the replica resistor control counter and an output of the resistor-under-adjustment control signal holding circuit and the state provided as input from the monitor circuit to the resistor-under-adjustment control signal holding circuit.

8. The impedance adjustment circuit according to claim 1, further comprising:

a circuit that gives a preset offset to a control signal output from the resistor-under-adjustment control signal holding circuit, the control signal causing a resistance value of the terminal resistor to be varied; and a code conversion circuit that performs code-conversion of the control signal to which the offset is given, an output of the code conversion circuit being delivered to the terminal resistor.

9. The impedance adjustment circuit according to claim 1, further comprising:

a code conversion circuit that receives a control signal output from the resistor-under-adjustment control signal holding circuit, the control signal causing a resistance value of the terminal resistor to be varied, the code conversion circuit performing code-conversion of the control signal; and a shift circuit that shifts an output of the code conversion circuit a preset number of bits, an output of the shift circuit being delivered to the terminal resistor.

10. The impedance adjustment circuit according to claim 1, wherein the replica resistor control counter includes a synchronization circuit that receives the result of comparison output from the comparator and timing-adjusts the result of comparison to output a resulting signal; and a circuit that performs control to cause the replica resistor control counter to execute a count operation every preset number of clock cycles in correspondence with timing adjustment by the synchronization circuit.

11. The impedance adjustment circuit according to claim 10 wherein the synchronization circuit includes a plurality of flip-flops connected in cascade and receiving a clock signal in common, and wherein the replica resistor control counter includes a counter of a preset number of bits provided as a circuit that that performs control to cause the replica resistor control counter to execute a count operation every preset number of clock cycles, the counter of the preset number of bits counting the clock signal to produce a signal to cause the replica resistor control counter to perform the count operation in association with delay of the multiple flip-flops.

12. The impedance adjustment circuit according to claim 1, wherein the replica resistor control counter includes a synchronization circuit that receives the result of comparison output from the comparator and timing-adjusts the result received to output the timing-adjusted result, the synchronization circuit including a plurality of flip-flops connected in cascades, the impedance adjustment circuit further comprising a frequency divider circuit that frequency-divides a clock signal to generate a plurality of frequency divided clock signals having different phases to one another, the frequency divided clock signals having different phases to one another from the frequency divider circuit being respectively delivered to the plurality of flip-flops connected in cascades of the synchronization circuits.

13. The impedance adjustment circuit according to claim 1, wherein the comparator has a preset hysteresis characteristic.

14. The impedance adjustment circuit according to claim 1, wherein the comparator compares a voltage divided by the replica resistor and the first resistor with a preset constant voltage in place of comparing the terminal voltage of the first resistor with the terminal voltage of the replica resistor.

15. The impedance adjustment circuit according to claim 1, wherein the resistor under adjustment includes a terminal resistor.

16. A semiconductor device including an impedance adjustment circuit as set forth in claim 1.

* * * * *